US012295243B2

(12) United States Patent
Yoon et al.

(10) Patent No.: US 12,295,243 B2
(45) Date of Patent: May 6, 2025

(54) DISPLAY DEVICE

(71) Applicant: SAMSUNG DISPLAY CO., LTD., Yongin-si (KR)

(72) Inventors: Young-Soo Yoon, Seoul (KR); Yun-Kyeong In, Hwaseong-si (KR); Hyunji Cha, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/411,302

(22) Filed: Jan. 12, 2024

(65) Prior Publication Data

US 2024/0147823 A1 May 2, 2024

Related U.S. Application Data

(63) Continuation of application No. 17/355,914, filed on Jun. 23, 2021, now Pat. No. 11,877,496.

(30) Foreign Application Priority Data

Aug. 26, 2020 (KR) .................. 10-2020-0108001

(51) Int. Cl.
H10K 59/88 (2023.01)
H10K 59/35 (2023.01)
H04M 1/02 (2006.01)
H10K 59/122 (2023.01)

(52) U.S. Cl.
CPC ............. H10K 59/88 (2023.02); H10K 59/35 (2023.02); H04M 1/0268 (2013.01); H10K 59/122 (2023.02)

(58) Field of Classification Search
CPC ....... H10K 59/88; H10K 59/35; H10K 59/122
USPC .......................................... 257/89
See application file for complete search history.

(56) References Cited

U.S. PATENT DOCUMENTS

| 10,657,908 B2 | 5/2020 | Yata |
| 10,756,136 B1 | 8/2020 | Ma et al. |
| 2018/0090722 A1* | 3/2018 | Kim ........................ H10K 71/00 |
| 2022/0069032 A1 | 3/2022 | Yoon et al. |
| 2022/0310711 A1* | 9/2022 | Liu ....................... H10K 59/122 |
| 2023/0371336 A1* | 11/2023 | Wang .................... H10K 59/352 |

FOREIGN PATENT DOCUMENTS

| CN | 110061014 | 7/2019 |
| CN | 110071160 | 7/2019 |
| JP | 2018-013718 A | 1/2018 |
| KR | 1020180049296 | 5/2018 |

* cited by examiner

Primary Examiner — Xia L Cross
(74) Attorney, Agent, or Firm — F. CHAU & ASSOCIATES, LLC

(57) ABSTRACT

A display device includes a display panel, a plurality of first pixels disposed in a first region of the display panel, a plurality of second pixels disposed in a second region of the display panel adjacent to the first region, and a plurality of dummy pixels disposed in a boundary region of the display panel between the first region and the second region. Intervals between the second pixels and the dummy pixels are uniform along the boundary region.

20 Claims, 14 Drawing Sheets

DISPLAY DEVICE

CROSS-REFERENCE TO RELATED APPLICATIONS

This U.S. non-provisional patent application is a continuation application of U.S. patent application Ser. No. 17/355,914 filed Jun. 23, 2021, which claims priority under 35 U.S.C. § 119 to Korean Patent Application No. 10-2020-0108001, filed on Aug. 26, 2020, the entire disclosures of which are hereby incorporated by reference in their entirety.

TECHNICAL FIELD

Embodiments of the present disclosure relate to a display device.

DISCUSSION OF RELATED ART

Generally, an electronic device such as a smartphone, a digital camera, a notebook computer, a navigation system, a smart television, etc., which provides images to a user, includes a display device for displaying the images. The display device generates images, and provides the generated images to a user through a display screen.

The display device includes a display panel including a plurality of pixels that generate an image, a driving unit that drives the pixels, and functional elements configured to provide various functions to the user. The functional elements include, for example, a speaker, a camera, a sensor, etc. A plurality of holes is defined in the display device, and the functional elements are disposed in the holes.

SUMMARY

Embodiments of the present disclosure provides a display device capable of preventing the occurrence of a band stain in a boundary region between a first display region and a second display region.

In an embodiment of the inventive concept, a display device includes a display panel, a plurality of first pixels disposed in a first region of the display panel, a plurality of second pixels disposed in a second region of the display panel adjacent to the first region, and a plurality of dummy pixels disposed in a boundary region of the display panel between the first region and the second region. Intervals between the second pixels and the dummy pixels are uniform along the boundary region.

In an embodiment of the inventive concept, a display device includes a display panel, a plurality of first pixels disposed in a first region of the display panel, a plurality of second pixels disposed in a second region of the display panel adjacent to the first region, a plurality of dummy pixels disposed in a boundary region of the display panel between the first region and the second region, and a plurality of transmission regions disposed between the dummy pixels and first pixels adjacent to the dummy pixels and between adjacent first pixels. A first interval between a first dummy pixel and a first second pixel adjacent to the first dummy pixel is smaller than a second interval between the adjacent first pixels.

In an embodiment of the inventive concept, a display device includes a display panel, a plurality of first pixels disposed in a first region of the display panel, a plurality of second pixels disposed in a second region of the display panel adjacent to the first region, and a plurality of dummy pixels disposed in a boundary region of the display panel between the first region and the second region. The first pixels and the second pixels are arranged in a first direction and a second direction which intersects the first direction. The second pixels include a plurality of light emission regions configured to display a plurality of colors. The light emission regions are arranged in a first diagonal direction intersecting the first and second directions and in a second diagonal direction intersecting the first diagonal direction. A first interval between a first dummy pixel and a first second pixel adjacent to the first dummy pixel is smaller than a second interval between adjacent first pixels, and is about equal to an interval between light emission regions adjacent to each other in the first diagonal direction and displaying a same color.

BRIEF DESCRIPTION OF THE DRAWINGS

The above and other features of the present inventive concept will become more apparent by describing in detail embodiments thereof with reference to the accompanying drawings, in which.

DETAILED DESCRIPTION

Figure 1:
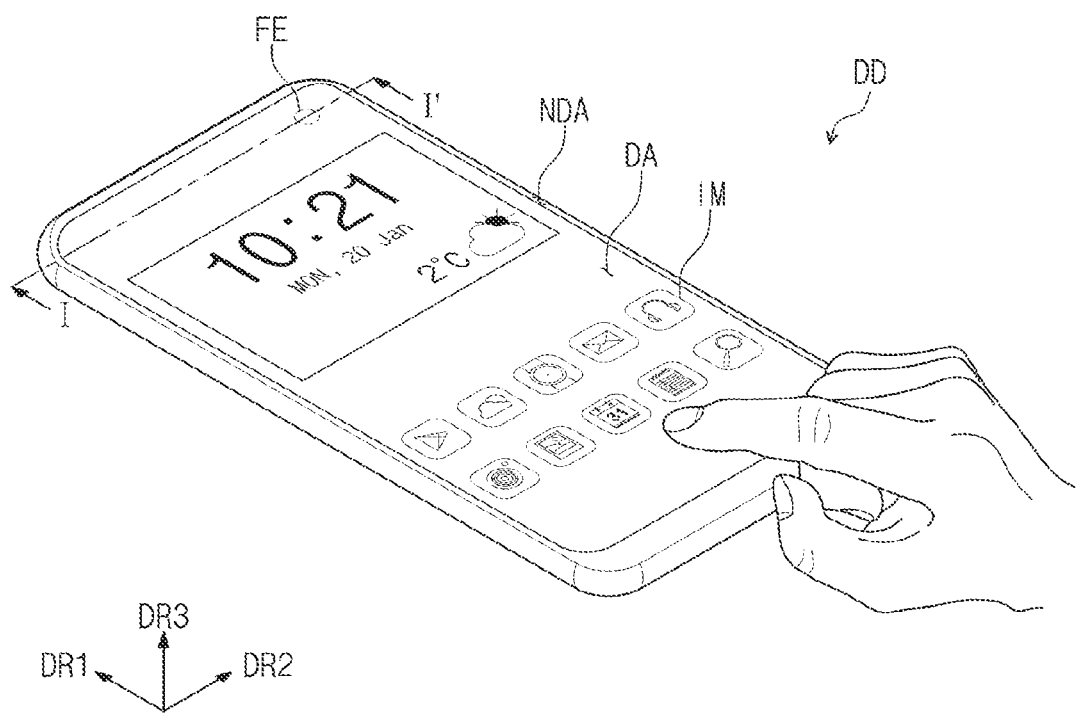
FIG. 1 is a perspective view of a display device according to an embodiment of the inventive concept.

Embodiments of the present inventive concept will be described more fully hereinafter with reference to the accompanying drawings. Like reference numerals may refer to like elements throughout the accompanying drawings In the present disclosure, when a component such as a film, a region, a layer, or an element, is referred to as being "on", "connected to", "coupled to", or "adjacent to" another component, it can be directly on, connected, coupled, or adjacent to the other component, or intervening components may be present. The term "adjacent to" may also mean "most closely adjacent to" or "closest adjacent to", unless the context clearly indicates otherwise. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationships between components should be interpreted in a like fashion.

The term "and/or," includes all combinations of one or more of which associated configurations may define.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of embodiments of the inventive concept.

The terms of a singular form may include plural forms unless the context clearly indicates otherwise.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

It should be understood that the terms "comprise", "include" or "have" are intended to specify the presence of stated features, integers, steps, operations, elements, components, or combinations thereof in the disclosure, but do not preclude the presence or addition of one or more other features, integers, steps, operations, elements, components, or combinations thereof.

It should be understood that descriptions of features or aspects within each embodiment should typically be considered as available for other similar features or aspects in other embodiments, unless the context clearly indicates otherwise.

Herein, when two or more elements or values are described as being substantially the same as or about equal to each other, it is to be understood that the elements or values are identical to each other, the elements or values are equal to each other within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations as understood by one of the ordinary skill in the art. Further, it is to be understood that while parameters may be described herein as having "about" a certain value, according to embodiments, the parameter may be exactly the certain value or approximately the certain value within a measurement error as would be understood by a person having ordinary skill in the art. It will be further understood that when two components or directions are described as extending substantially parallel or perpendicular to each other, the two components or directions extend exactly parallel or perpendicular to each other, or extend approximately parallel or perpendicular to each other within a measurement error as would be understood by a person having ordinary skill in the art. Other uses of these terms and similar terms to describe the relationships between components should be interpreted in a like fashion.

FIG. 1 is a perspective view of a display device according to an embodiment of the inventive concept.

Referring to FIG. 1, a display device DD may include a display region DA, a functional element FE disposed in the display region DA, and a non-display region NDA adjacent to the display region DA. The non-display region NDA may surround the display region DA. The display region DA displays an image, and an image is not displayed in the non-display region NDA. The non-display region NDA may define the edge of the display device DD, and may be printed in a predetermined color. For example, the non-display region NDA may correspond to a bezel portion of the display device DD.

The functional element FE may be disposed near an upper end of the display device DD and in a portion of the display region DA adjacent to the right side of the display device DD. However, the disposition position of the functional element FE is not limited thereto. For example, the functional element may be disposed near another end of the display device DD other than the upper end, and may be disposed in a portion of the display region DA adjacent to another side of the display device DD other than the right side. The functional element FE may include a camera, as shown in FIG. 1. However, the functional element FE is not limited thereto. For example, according to embodiments, the functional element FE may include a speaker and sensors having various functions. When the functional element FE is provided in plural, the plurality of functional elements may be disposed at various positions of the display region DA.

The display device DD may have a rectangular shape having long sides extending in a first direction DR1 and short sides (relative to the long sides) extending in a second direction DR2 which crosses the first direction DR1. However, embodiments of the inventive concept are not limited thereto. For example, according to embodiments, the display device DD may have various shapes such as a circular shape and a polygonal shape. A vertex of a quadrangular shape of the display device DD may be formed as a curve. For example, according to embodiments, the display device DD may have a rounded rectangular shape.

Hereinafter, a direction substantially perpendicularly intersecting a plane defined by the first and second directions DR1 and DR2 is defined as a third direction DR3. The third direction DR3 may also be referred to herein as a thickness direction of the display device DD. In the present disclosure, "when viewed on a plane" or "when viewed in a plan view" may mean when viewed from the third direction DR3.

An upper surface of the display device DD may be defined as a display surface, and may have a plane defined by the first direction DR1 and the second direction DR2. An image generated by the display device DD may be provided to a user through the display surface. The image displayed by the display device DD may be, for example, an icon image(s)

corresponding to a certain functionality of the display device DD. When the user touches an icon image IM displayed on the display surface, certain functionality, including providing images corresponding to the icon image IM, may be provided to the user.

In FIG. 1, the display device DD is exemplarily illustrated as a mobile phone. However, the display device DD is not limited thereto. For example, according to embodiments, the display device DD may be used in large electronic devices such as, for example, televisions or external advertisement boards, and also in small and medium sized electronic devices such as, for example, personal computers, notebook computers, car navigation system units, game machines, and tablet computers. However, these are merely examples, and the display device DD may be employed in other electronic devices not described herein.

Figure 2:
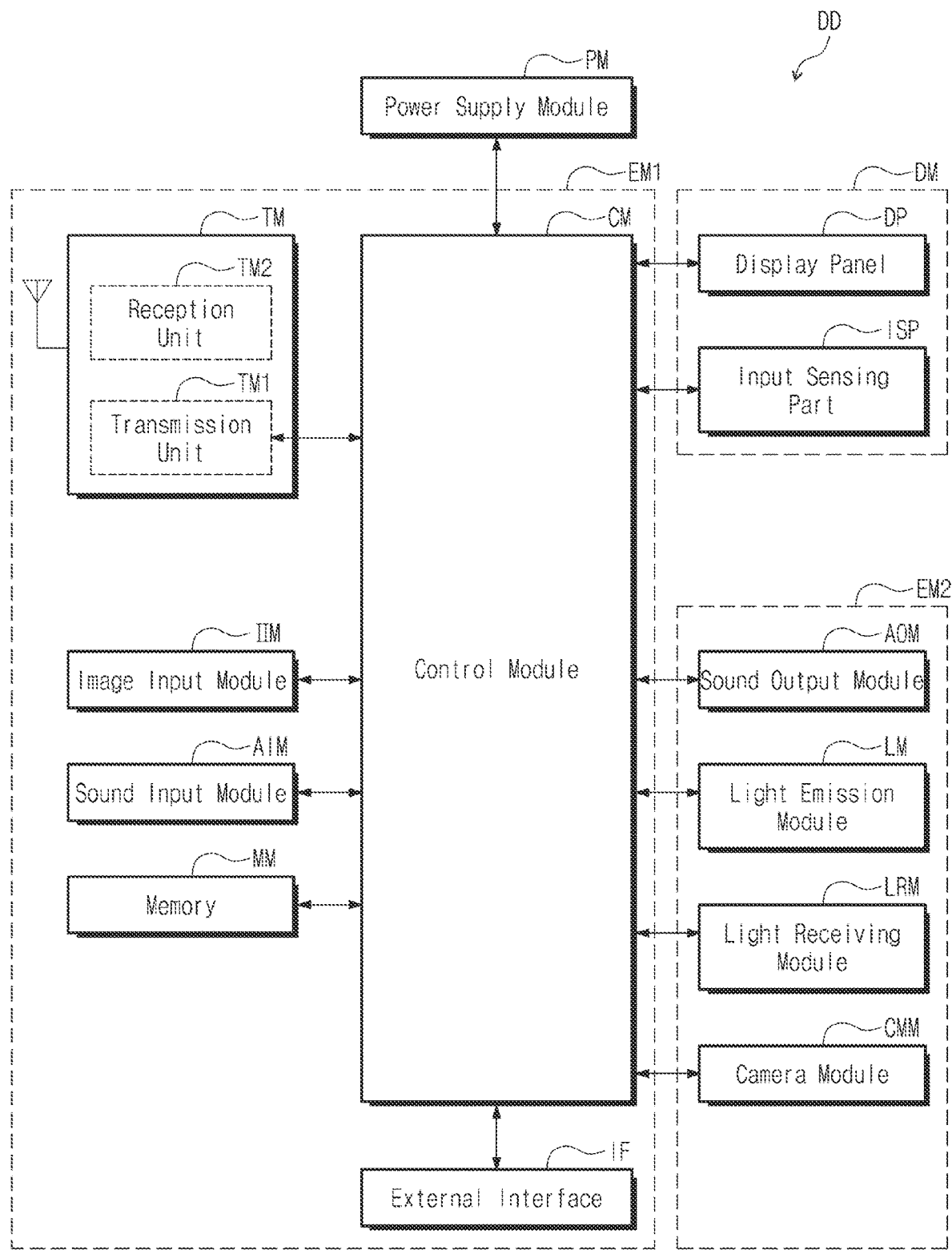
FIG. 2 is a block diagram of the display device illustrated in FIG. 1.

FIG. 2 is a block diagram of the display device illustrated in FIG. 1.

Referring to FIG. 2, the display device DD according to an embodiment of the inventive concept may include a display module DM, a power supply module PM, a first electronic module EM1, and a second electronic module EM2. The display module DM, the power supply module PM, the first electronic module EM1, and the second electronic module EM2 may be electrically connected to each other. The power supply module PM may supply power utilized for the operation of the display device DD. The power supply module may include a battery.

The first electronic module EM1 and the second electronic module EM2 may include various functional modules for operating the display device DD. The first electronic module EM1 and the second electronic module EM2 may be directly mounted on a main board electrically connected to the display module DM, or may be mounted on a separate substrate and electrically connected to the main board through, for example, a connector and the like.

The first electronic module EM1 may include, for example, a control module CM, a wireless communication module TM, an image input module IIM, a sound input module AIM, a memory MM, and an external interface IF. The control module CM controls the overall operation of the display device DD, and may either activate or deactivate the display module 200. The control module CM may control other modules such as, for example, the image input module TIM or the sound input module AIM, on the basis of a touch signal received from the display module DM.

The wireless communication module TM may transmit/receive wireless signals with other terminals by using, for example, BLUETOOTH or WI-FI, or may transmit/receive voice signals by using a general communication line. The wireless communication module TM may include a transmission unit TM1 configured to transmit a signal and a reception unit TM2 configured to receive the signal. The transmission unit TM may also be referred to as a transceiver.

The image input module TIM may process an image signal and convert the processed image signal into image data displayable on the display module DM. The sound input module AIM may receive an external sound signal through a microphone in, for example, a recording mode, a voice recognition mode, or the like, and convert the received external sound signal into electrical voice data. The external interface IF may serve as an interface to be connected to, for example, an external charger, a wired/wireless data port, a card socket (for example, a memory card, a SIM/UIM card, etc.), and the like.

The second electronic module EM2 may include, for example, a sound output module AOM, a light emission module LM, a light receiving module LRM, and a camera module CMM. The sound output module AOM may convert sound data received from the wireless communication module TM or sound data stored in the memory MM, and output the converted sound data to outside of the display device DD.

The light emission module LM may generate and output infrared light. The light emission module LM may sense an infrared ray. The light receiving module LRM may include a CMOS sensor which may be activated when an infrared ray of a predetermined level or higher is sensed. The infrared ray is output from the light emission module LM, and then reflected by an external object, and then the reflected infrared light may be incident on the light receiving module LRM.

The camera module CMM may capture an external image. A speaker of the sound output module AOM, a camera of the camera module CMM, a sensor of the light receiving module LRM, and the like may be the above-described functional element FE.

The display module DM may include a display panel DP and an input sensing part ISP. The display panel DP may use image data provided from the control module DM to display an image. The input sensing part ISP senses an external input (e.g., a user's finger or hand), and a sensed signal may be converted to an input signal and transmitted to the control module CM. The control module CM may control the operation of the display panel DP in response to the input signal of the input sensing part ISP.

Figure 3:
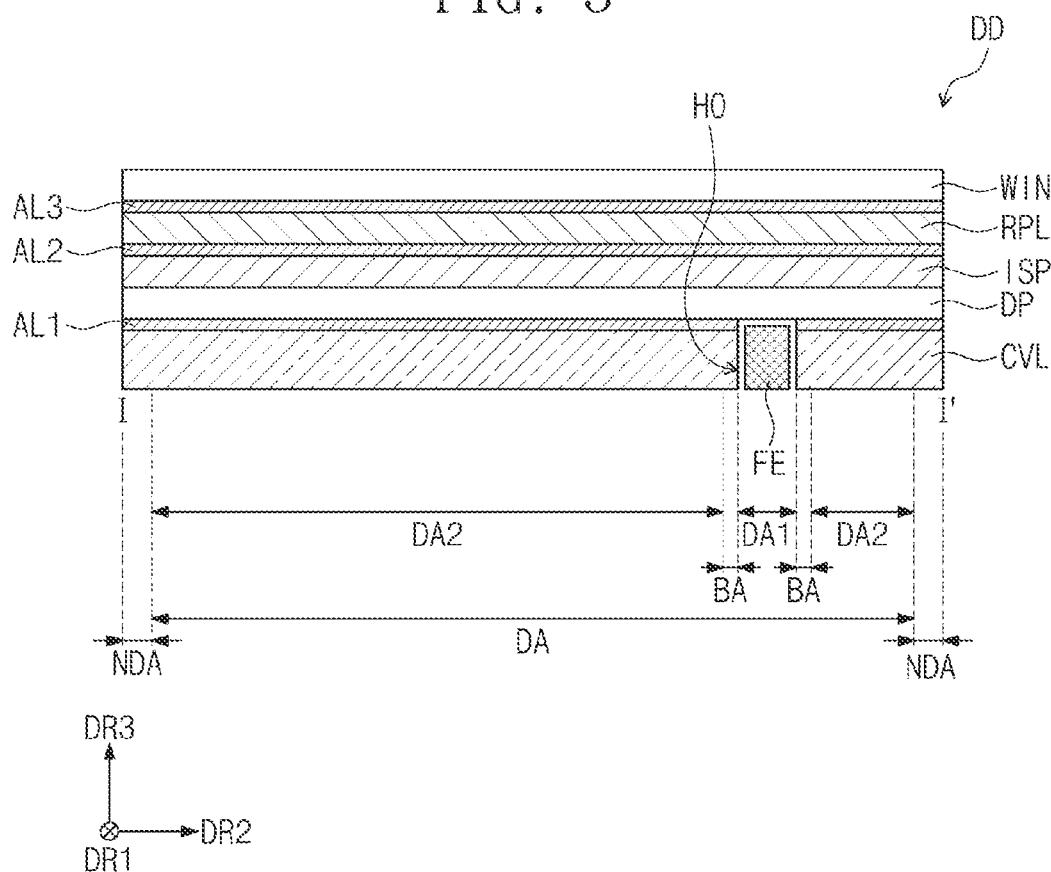
FIG. 3 is a cross-sectional view taken along line I-I' of FIG. 1.

FIG. 3 is a cross-sectional view taken along line I-I' of FIG. 1.

Referring to FIG. 3, the display device DD may include the display panel DP, the input sensing part ISP, a reflection prevention layer RPL, a window WIN, a cover layer CVL, and first to third pressure-sensitive adhesive layers AL1, AL2 and AL3. The display module DM illustrated in FIG. 2 may further include the reflection prevention layer RPL, the window WIN, and the cover layer CVL, as well as the display panel DP and the input sensing part ISP illustrated in FIG. 3.

The display panel DP may include the display region DA and the non-display region NDA disposed adjacent to the display region DA. The display region DA may include a first display region DA1, a second display region DA2 disposed adjacent to the first display region DA1, and a boundary region BA disposed between the first display region DA1 and the second display region DA2. The second display region DA2 may surround the first display region DAL The first display region DA1 may also be referred to herein a first region, and the second display region DA2 may also be referred to herein as a second region.

The display panel DP may be a flexible display panel. In addition, the display panel DP according to an embodiment of the inventive concept may be a light emission type display panel, but is not particularly limited thereto. For example, the display panel DP may be an organic light emission display panel or a quantum dot light emission display panel. A light emission layer of an organic light emission display panel may include, for example, an organic light emission material. A light emission layer of a quantum dot light emission display panel may include, for example, a quantum dot, a quantum load, and the like. Hereinafter, the display panel DP will be described as an organic light emission display panel.

The input sensing part ISP may be disposed on the display panel DP. The input sensing part ISP may include a plurality of sensors for sensing an external input. The sensors may sense the external input in a capacitive manner. In an embodiment, the input sensing part ISP may be directly manufactured on the display panel DP when manufacturing the display panel DP. However, embodiments of the inventive concept are not limited thereto. For example, according to embodiments, the input sensing part ISP may be manufactured as a separate panel from the display panel DP, and be attached to the display panel DP by a pressure-sensitive adhesive layer. Thus, according to embodiments, the input sensing part ISP may be integrally formed with the display panel DP, or may be separately formed and attached to the display panel DP.

The reflection prevention layer RPL may be disposed on the input sensing part ISP. The reflection prevention layer RPL may be an external light reflection prevention film. The reflection prevention layer RPL may reduce the reflectance of external light incident from above the display device DD toward the display panel DP. The reflection prevention layer RPL may include a phase retarder and/or a polarizer.

The window WIN may be disposed on the reflection prevention layer RPL. The window WIN may protect the display panel DP, the input sensing part ISP, and the reflection prevention layer RPL from, for example, external impact and scratches. The window WIN may include optically transparent properties, and thus, may also be referred to as an optically transparent window WIN.

The cover layer CVL may be disposed below the display panel DP. The cover layer CVL may protect the display panel DP from external impact applied to a lower portion of the display panel DP. The cover layer CVL may include a foam sheet having a predetermined elastic force, and may absorb external impact.

The first to third pressure-sensitive adhesive layers AL1 to AL3 may include a first pressure-sensitive adhesive layer AL1, a second pressure-sensitive adhesive layer AL2, and a third pressure-sensitive adhesive layer AL3. The first pressure-sensitive adhesive layer AL1 may be disposed between the display panel DP and the cover layer CVL. The display panel DP and the cover layer CVL may be bonded to each other by the first pressure-sensitive adhesive layer AL1. The second pressure-sensitive adhesive layer AL2 may be disposed between the reflection prevention layer RPL and the input sensing part ISP. The reflection prevention layer RPL and the input sensing part ISP may be bonded to each other by the second pressure-sensitive adhesive layer AL2. The third pressure-sensitive adhesive layer AL3 may be disposed between the window WIN and the reflection prevention layer RPL. The window WIN and the reflection prevention layer RPL may be bonded to each other by the third pressure-sensitive adhesive layer AL3.

The functional element FE may be disposed below the first display region DA1. When viewed on a plane, in a portion of the cover layer CVL overlapping the first display region DA1, a hole HO may be defined. The functional element FE may be disposed in the hole HO. As described above, the functional element FE may include a camera. External light may be provided to the camera through the window WIN.

Figure 4:
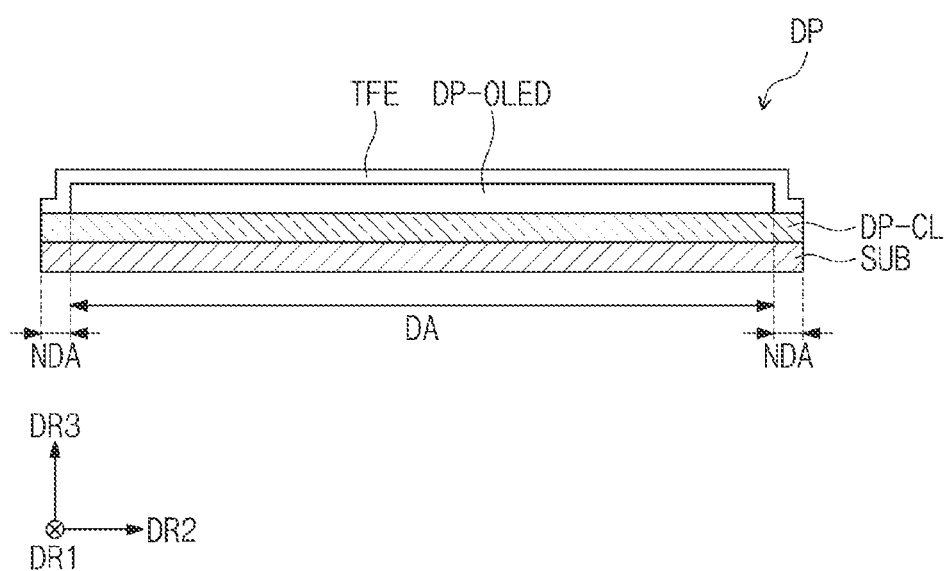
FIG. 4 is a view exemplarily illustrating the cross-section of a display panel illustrated in FIG. 3.

FIG. 4 is a view exemplarily illustrating the cross-section of the display panel illustrated in FIG. 3.

Referring to FIG. 4, the display panel DP may include a substrate SUB, a circuit element layer DP-CL disposed on the substrate SUB, a display element layer DP-OLED disposed on the circuit element layer DP-CL, and a thin film encapsulation layer TFE disposed on the display element layer DP-OLED.

The substrate SUB may include a display region DA and a non-display region NDA adjacent to the display region DA. The non-display region NDA may surround the display region DA. The substrate SUB may include a flexible plastic material. For example, the substrate SUB may include polyimide (PI).

The display element layer DP-OLED may be disposed in the display region DA. The thin film encapsulation layer TFE may be disposed on the circuit element layer DP-CL and may cover the display element layer DP-OLED.

A plurality of pixels may be disposed on the circuit element layer DP-CL and on the display element layer DP-OLED. For example, each of the pixels may include a transistor disposed on the circuit element layer DP-CL and a light emitting element disposed on the display element layer DP-OLED to be connected to the transistor.

Figure 5:
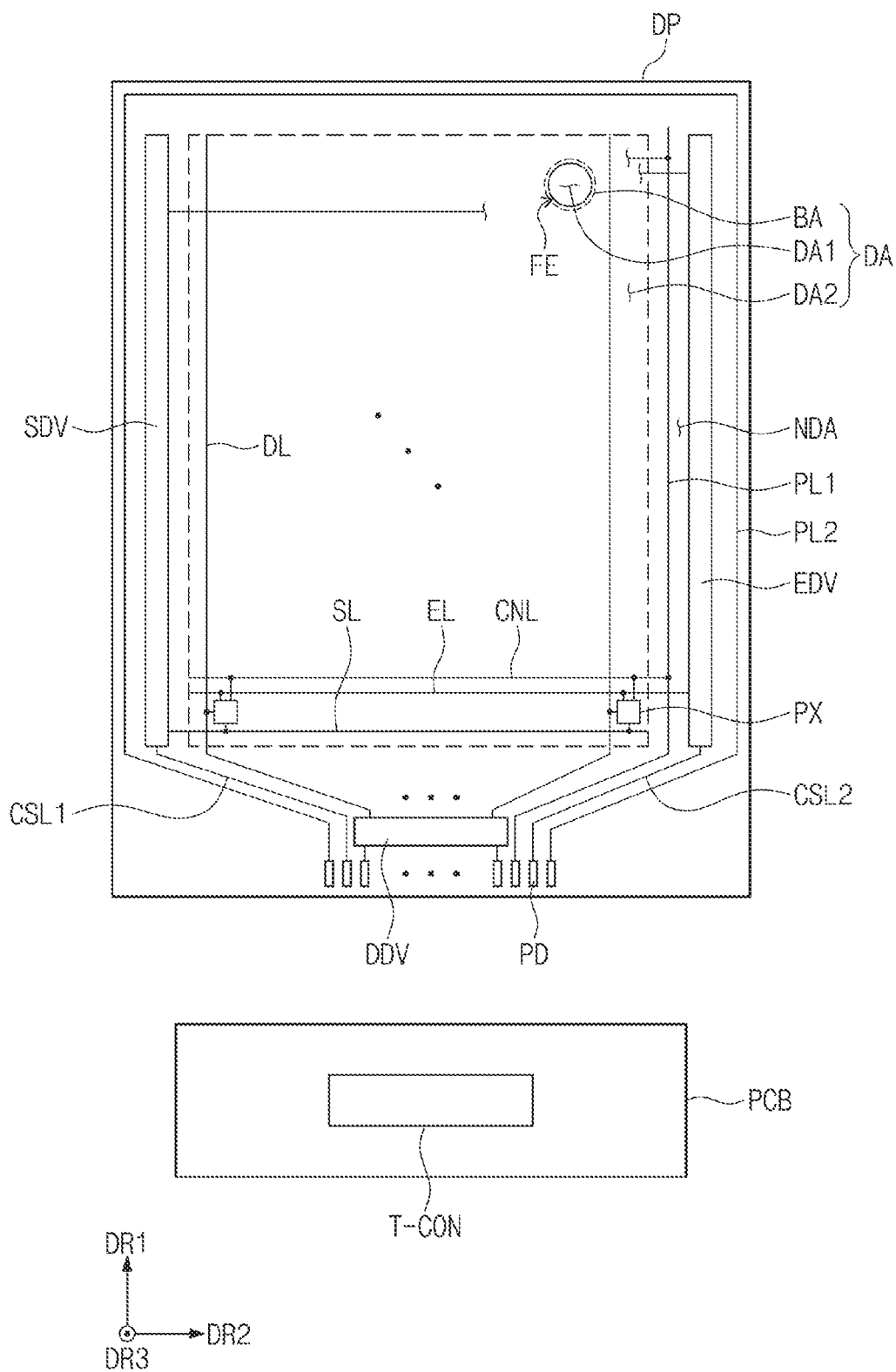
FIG. 5 is a plan view of the display panel illustrated in FIG. 4.

FIG. 5 is a plan view of the display panel illustrated in FIG. 4.

Referring to the FIG. 5, the display device DD may include the display panel DP, a scan driver SDV, a data driver DDV, a light emission driver EDV, a printed circuit board PCB, and a timing controller T-CON. The display panel DP may have a rectangular shape which has long sides extending in the first direction DR1 and short sides (relative to the long sides) extending in the second direction DR2. However, the shape of the display panel DP is not limited thereto.

The display panel DP may include the display region DA and the non-display region NDA surrounding the display region DA. The display region DA may include the first display region DA1, the boundary region BA surrounding the first display region DA1, and the second display region DA2 surrounding the boundary region BA.

In an embodiment, as shown in FIG. 5, the first display region DA1 may have a circular shape. However, the shape of the first display region DA1 is not limited thereto. As described above, the functional element FE may be disposed below the first display region DA1. In an embodiment, as shown in FIG. 5, the first display region DA1 is adjacent to an upper side and the right side of the second display region DA2. However, the position of the first display region DA1 is not limited thereto.

The display panel DP may include a plurality of pixels PX, a plurality of scan lines SL, a plurality of data lines DL, a plurality of light emission lines EL, first and second control lines CSL1 and CSL2, first and second power lines PL1 and PL2, connection lines CNL, and a plurality of pads PD.

The pixels PX may be disposed in the display region DA. The scan driver SDV and the emission driver EDV may be disposed in the non-display region NDA. The scan driver SDV may be disposed adjacent to one long side of the display panel DP, and the emission driver EDV may be disposed adjacent to the opposite long side of the display panel DP. The data driver DDV may be disposed in the non-display region NDA, and may be adjacent to any one of short sides of the display panel DP (relative to long sides of the display panel DP). When viewed on a plane, the data driver DDV may be adjacent to a lower end of the display panel DP. The data driver DDV may be manufactured in the form of an integrated circuit chip and mounted on the display panel DP.

The scan lines SL may extend in the second direction DR2 and may be connected to the pixels PX and the scan driver SDV. The data lines DL may extend in the first direction DR1 and may be connected to the pixels PX and the data driver DDV. The light emission lines EL may extend in the second direction DR2 and may be connected to the pixels PX and light emission driver EDV.

A first power line PL1 may extend in the first direction DR1 and may be disposed in the non-display region NDA. The first power line PL1 may be disposed between the display region DA and the light emission driver EDV. However, the location of the first power line PLl1 is not limited thereto. The first power line PL1 may be disposed between the display region DA and the scan driver SDV.

The connection lines CNL may extend in the second direction DR2 and be arranged in the first direction DR1, such that the connection lines CL are connected to the first power line PL1 and the pixels PX. A first voltage may be applied to the pixels PX through the first power line PL1 and the connection lines CNL which are connected to each other.

A second power line PL2 may be disposed in the non-display region NDA. The second power line PL2 may extend along the long sides of the display panel DP and another short side of the display panel DP at which the data driver DDV is not disposed. The second power line PL2 may be disposed at an outer periphery than the scan driver SDV and the light emission driver EDV.

The second power line PL2 may extend toward the display region DA and may be connected to the pixels PX. A second voltage having a lower level than the first voltage may be applied to the pixels PX through the second power line PL2.

A first control line CSL1 may be connected to the scan driver SDV, and may extend toward a lower end of the display panel DP. A second control line CSL2 may be connected to the light emission driver EDV, and may extend toward the lower end of the display panel DP. The data driver DDV may be disposed between the first control line CSL1 and the second control line CSL2.

The pads PD may be disposed on the display panel DP. The pads PD may be adjacent to a lower end of the display panel DP. The data driver DDV, the first power line PL1, the second power line PL2, the first control line CSL1, and the second control line CSL2 may be connected to the pads PD. The data lines DL may be connected to the data driver DDV, and the data driver DDV may be connected to the pads PD corresponding to the data lines DL.

The printed circuit board PCB may be connected to the pads PD. The timing controller T-CON may be manufactured as an integrated circuit chip and mounted on the printed circuit board PCB. The timing controller T-CON may be connected through the printed circuit board PCB to the pads connected to the data driver DDV and the first and second control lines CL1 and CL2. A voltage generator that generates first and second voltages may be disposed on the printed circuit board PCB, and be connected to the pads PD connected to the first and second power lines PL1 and PL2.

The timing controller T-CON may output a scan control signal, a data control signal, a light emission control signal, and image signals. The scan control signal may be provided to the scan driver SDV through the first control line CSL1, and may be provided to the light emission driver EDV through the second control line CSL2. The data control signal and the image signals may be provided to the data driver DDV.

The scan driver SDV may generate a plurality of scan signals in response to the scan control signal, and the scan signals may be applied to the pixels PX through the scan lines SL. The data driver DDV may generate a plurality of data voltages corresponding the image signals in response to the data control signal. The data voltages may be applied to the pixels PX through the data lines DL. The light emission driver EDV may generate a plurality of light emission signals in response to the light emission control signal, and the light emission signals may be applied to the pixels PX through the light emission lines EL.

The pixels PX may be provided with the data voltages in response to the scan signals. The pixels PX may display an image by emitting light of a luminance corresponding to the data voltages in response to the light emission signals. The light emission duration of the pixels PX may be controlled by the light emission signals.

Figure 6:
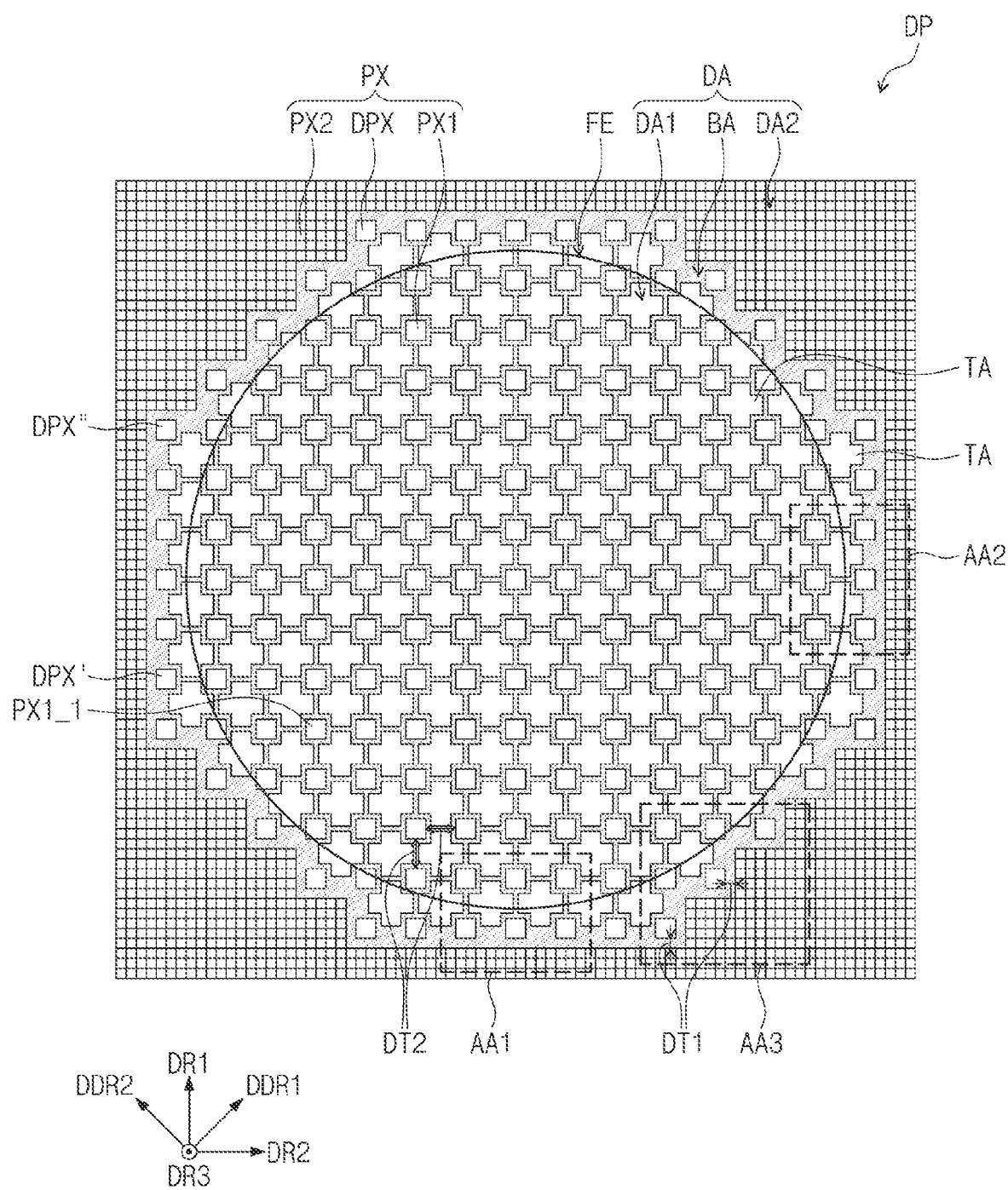
FIG. 6 is a view showing the configuration of a first display region, a boundary region, and a second display region adjacent to the boundary region illustrated in FIG. 5.

FIG. 6 is a view showing the configuration of a first display region, a boundary region, and a second display region adjacent to the boundary region illustrated in FIG. 5.

Referring to FIG. 6, the pixels PX may include a plurality of first pixels PX1, a plurality of second pixels PX2, and a plurality of dummy pixels DPX. The first pixels PX1 may be disposed in the first display region DA1, the second pixels PX2 may be disposed in the second display region DA2, and the dummy pixels DPX may be disposed in the boundary region BA.

In the embodiment of FIG. 6, it is illustrated that the boundary region BA adjacent to the second display region DA2 has an octagonal shape, schematically. However, the shape of the boundary region BA is not limited thereto.

The first pixels PX1 may be arranged in a matrix form in the first display region DA1. For example, the first pixels PX1 may be arranged in the first direction DR1 and the second direction DR2. However, the arrangement of the first pixels PX1 is not limited thereto.

The second pixels PX2 may be arranged in a matrix form in the second display region DA2. For example, the second pixels PX2 may be arranged in the first direction DR1 and the second direction DR2. However, the arrangement of the second pixels PX2 is not limited thereto.

The dummy pixels DPX may surround the first display region DA1 along the boundary region BA. Since the functional element FE is disposed below the first display region DA1, the dummy pixels DPX may surround the functional element FE when viewed on a plane. Therefore, when viewed on a plane, the dummy pixels DPX may be disposed between the functional element FE and the second display region DA2.

In the embodiment of FIG. 6, it is illustrated that the dummy pixels DPX are arranged in one row to surround the first display region DA1 along the boundary region BA. However, the disposition of the dummy pixels DPX is not limited thereto. For example, according to embodiments, the dummy pixels DPX may be disposed in a plurality of rows. Here, one row means a state in which the dummy pixels DPX are arranged in a specific direction (for example, a curved direction which forms a circle in FIG. 6) one by one.

The first display region may display an image via the first pixels PX1, the second display region DA2 may display an image via the second display pixels PX2, and the boundary region BA may display an image via the dummy pixels DPX. A predetermined image may be displayed in the display region DA by light generated from the first pixels PX1, the second pixels PX2, and the dummy pixels DPX.

Referring to a comparative example, if the dummy pixels DX are not disposed in the boundary region BA, the boundary region BA may be visually recognized by a user. For example, in this case, the boundary region BA may appear in the form of a ring to a user viewing the display panel DP, thereby decreasing the display quality of the display panel DP. However, in an embodiment of the inventive concept, since light is generated in the boundary region BA by the dummy pixels DPX, the boundary region BA is not visually recognized by a user, or is less visually recognizable to a user, thereby increasing the display quality of the display panel DP.

The first pixels PX1 may have substantially the same shape as the dummy pixels DPX. The second pixels PX2 may have a different shape than the first pixels PX1 and the dummy pixels DPX. The shapes of the first pixels PX1, the dummy pixels DPX, and the second pixels PX2 will be described in further detail below.

The display panel DP may include a plurality of transmission regions TA. The transmission regions TA may be disposed between adjacent first pixels PX1 of the first pixels PX1. In addition, the transmission regions TA may be disposed between the dummy pixels DPX and the first pixels PX1 adjacent to the dummy pixels DPX.

In the embodiment of FIG. 6, the transmission regions TA have a cross shape. However, the shape of the transmission regions TA is not limited thereto. The transmission regions TA may be disposed around each of the first pixels PX1. For example, each first pixel PX1 may be surrounded by a plurality of transmission regions TA. The transmission regions TA may be disposed in a first diagonal direction DDR1 and a second diagonal direction DDR2 with respect to each of the first pixels PX1.

The first diagonal direction DDR1 may be defined as a direction intersecting the first and second directions DR1 and DR2 on a plane defined by the first and second directions DR1 and DR2. The second diagonal direction DDR2 may be defined as a direction intersecting the first diagonal direction DDR1 on a plane defined by the first and second directions DR1 and DR2. The first and second directions DR1 and DR2 may vertically intersect each other, and the first and second diagonal directions DDR1 and DDR2 may vertically intersect each other.

In the embodiment of FIG. 6, the first pixels PX1 may have a quadrangular shape having sides extending substantially parallel to the first direction DR1 and sides extending substantially parallel to the second direction DR2. The transmission regions TA may be disposed in the first and second diagonal directions DDR1 and DDR2 with respect to each of the first pixels PX1 by being disposed adjacent to vertexes of each of the first pixels PX1. However, this disposition position is exemplary, and the disposition position of the transmission regions TA is not limited thereto.

The dummy pixels DPX may have a quadrangular shape having sides extending substantially parallel to the first direction DR1 and sides extending substantially parallel to the second direction DR2. The transmission regions TA may be adjacent to some vertexes among vertexes of each of the dummy pixels DPX.

The number of transmission regions TA adjacent (e.g., most closely adjacent) to each of the dummy pixels DPX may be smaller than the number of transmission regions TA adjacent (e.g., most closely adjacent) to each of the first pixels PX1. For example, in an embodiment, the number of transmission regions TA adjacent (e.g., most closely adjacent) to first pixels PX1_1 may be 4, the number of transmission regions TA adjacent (e.g., most closely adjacent) to some dummy pixels DPX' may be 2, and the number of transmission regions TA adjacent (e.g., most closely adjacent) to some other dummy pixels DPX" may be 1. For example, in an embodiment, 4 transmission regions TA may be directly adjacent to first pixels PX1_1 disposed in the first display region DA1 (e.g., the 4 transmission regions may surround each of first pixels PX1_1), 2 transmission regions TA may be disposed directly adjacent to dummy pixels DPX' disposed in the boundary region BA surrounding the first display region DA1, and 1 transmission region TA may be disposed adjacent to dummy pixels DPX" disposed in the boundary region BA surrounding the first display region DA1.

Herein, when two certain elements "A" are described as being "directly adjacent" to each other, it may mean that no other element "A" is disposed between the two adjacent certain elements "A." Similarly, when a certain element "A" and a certain element "B" are described as being "directly adjacent" to each other, it may mean that no other element "A" and no other element "B" are disposed between the adjacent certain elements "A" and "B." Other uses of the term "directly adjacent" should be construed in a like manner, unless the context clearly indicates otherwise.

The transmission regions TA may have a higher light transmittance than the first and second pixels PX1 and PX2. Light transmitted through the transmission regions TA may be provided to the functional element FE disposed below the first display region DA1.

An image may be displayed by the first pixels PX1 in the first display region DA1, and light may be provided to the functional element FE through the transmission regions TA. Therefore, the first display region DA1 may display the image, and the functional element FE provided with the light may operate a specific function (e.g., when the functional element FE is a camera, the specific function of the functional element FE may be capturing images).

An interval between a dummy pixel DPX and an adjacent second pixel PX2 may be defined as a first interval DT1. That is, an interval between a dummy pixel DPX and a second pixel PX2 most closely adjacent to the dummy pixel DPX may be defined as a first interval DT1. An interval between first pixels PX1 adjacent to each other may be defined as a second interval DT2. That is, an interval between first pixels PX most closely adjacent to each other may be defined as a second interval DT2. In the present disclosure, "an interval between components adjacent to each other" may refer to an interval between two components adjacent to each other. Herein, the terms "interval" and "distance" may be used interchangeably.

The second interval DT2 may be defined as an interval between first pixels PX1 adjacent to each other in the first direction DR1 and an interval between first pixels PX1 adjacent to each other in the second direction DR2. The first interval DT1 may be smaller than the second interval DT2. The first interval DT1 will be described in further detail below with reference to FIGS. 7, 8 and 9.

Along the boundary region BA surrounding the first display region DA1, intervals between the dummy pixels DPX and the second pixels PX2 may be uniformly maintained. For example, first intervals DT1 between the dummy pixels DPX and the second pixels PX2 may be uniformly maintained along the boundary region BA. For example, according to embodiments, the first interval DT1 may refer to the distance between a dummy pixel DPX in the boundary region BA and a closest second pixel PX2 in the second non-display region DA2 in the first direction DR1 and the second direction DR2, and the first interval DT1 may be uniform along the boundary region BA for all of the dummy pixels DPX. That is, according to embodiments, along the boundary region BA, the distance between the dummy pixels DPX and their respective closest adjacent second pixels PX2 in the second non-display region A2 in the first direction DR1 and the second direction DR2 may be uniform (e.g., may be DT1). According to embodiments, the first intervals DT1 between every one of the dummy pixels DPX and the second pixels PX2 in the first direction DR1 and the second direction DR2 may be uniform. That is, according to embodiments, none of the first intervals DT1 are non-uniform.

Referring to a comparative example, when intervals between the dummy pixels DPX and the second pixels PX2 are not maintained to be uniform, a difference in luminance may be visually recognized. For example, in a portion in which the intervals between the dummy pixels DPX and the second pixels PX2 are relatively large, the luminance may be visually recognized to be lower than that of surrounding portions, and thus, may be visually recognized as a band stain, thereby decreasing the display quality of the display panel DP.

However, in an embodiment of the inventive concept, since the intervals between the dummy pixels DPX and the second pixels PX2 are maintained to be uniform, the luminance in the boundary region BA may be maintained to be constant. As a result, visual defects which may occur in the boundary region BA, such as a band stain, may be prevented or reduced.

Figure 7:
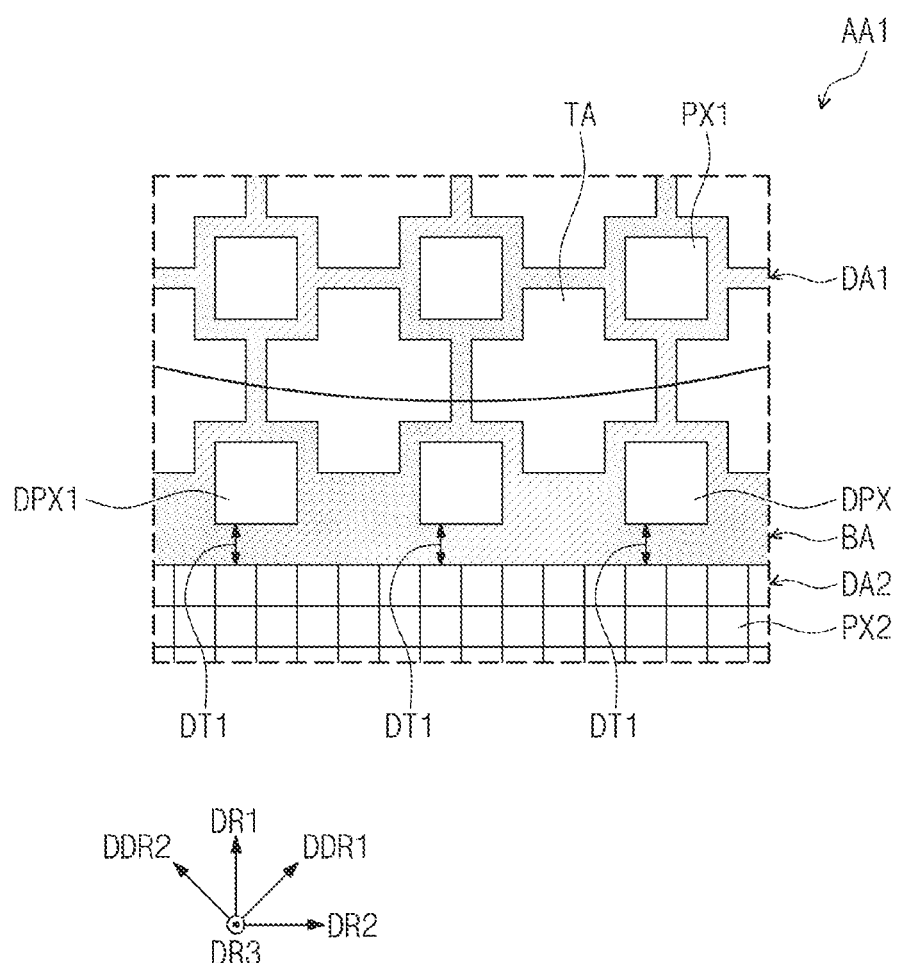
FIG. 7 is an enlarged view of a first region AA1 illustrated in FIG. 6.
Figure 8:
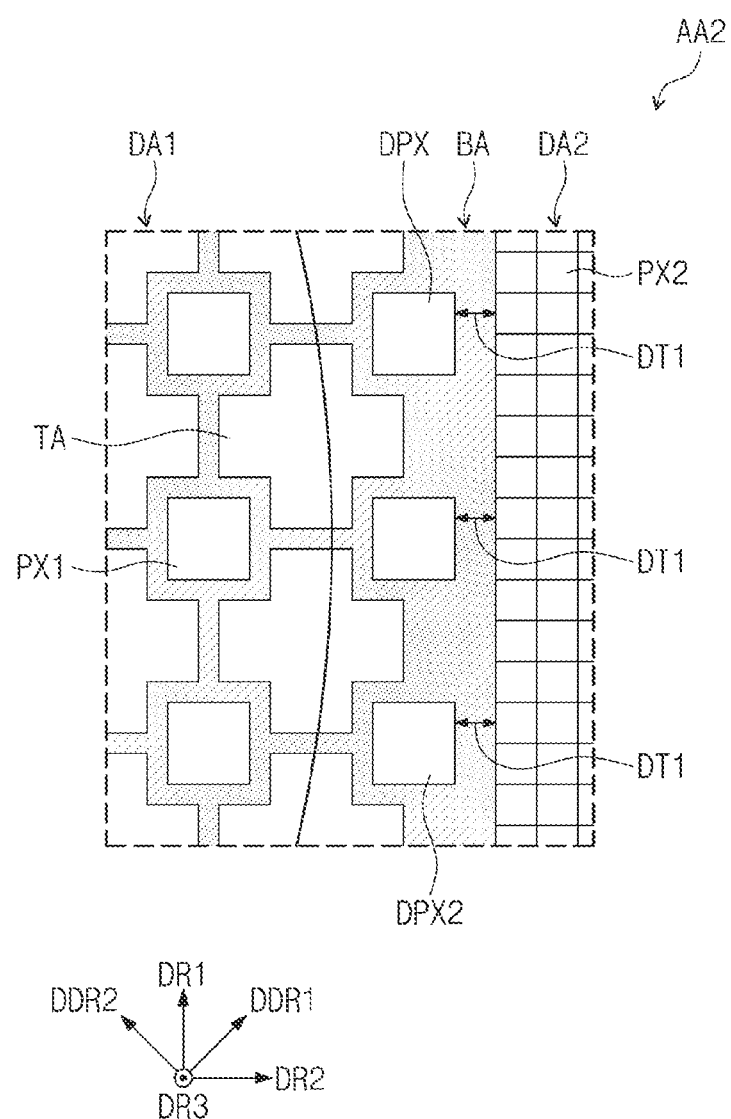
FIG. 8 is an enlarged view of a second region AA2 illustrated in FIG. 6.
Figure 9:
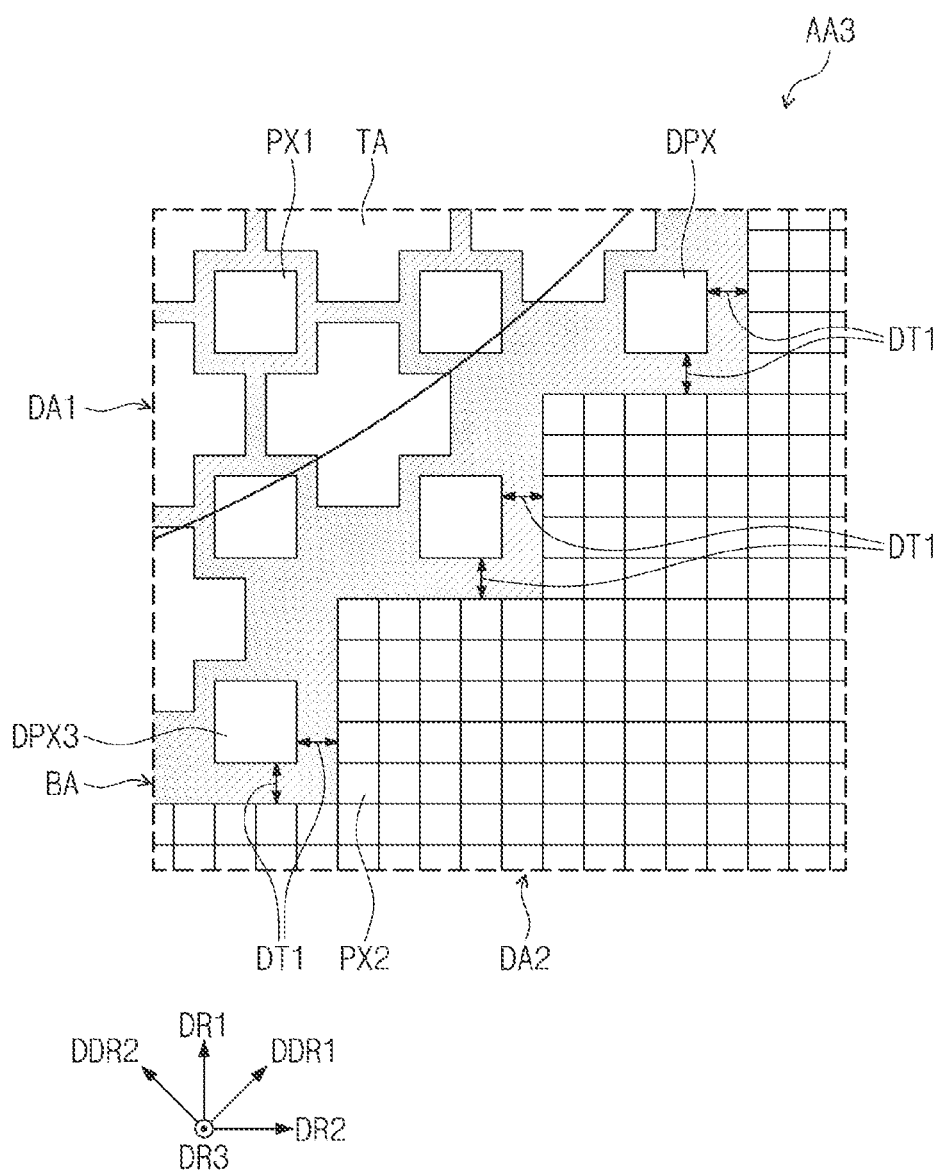
FIG. 9 is an enlarged view of a third region AA3 illustrated in FIG. 6.

FIG. 7 is an enlarged view of a first region AA1 illustrated in FIG. 6. FIG. 8 is an enlarged view of a second region AA2 illustrated in FIG. 6. FIG. 9 is an enlarged view of a third region AA3 illustrated in FIG. 6.

FIG. 7 illustrates a portion of the boundary region BA of an octagonal shape defining a lower side of the boundary region BA shown in FIG. 6 and extending in the second direction DR2. FIG. 8 illustrates a portion of the boundary region BA of an octagonal shape defining a right side of the boundary region BA shown in FIG. 6 and extending in the first direction DR1. FIG. 9 illustrates a portion of the boundary region BA of an octagonal shape defining a lower right side of the boundary region BA shown in FIG. 6 and extending in the first diagonal direction DDR1.

Referring to FIGS. 6 and 7, the dummy pixels DPX may include a plurality of first dummy pixels DPX1 disposed in the boundary region BA substantially parallel to the second direction DR2. The first dummy pixels DPX1 may be arranged in the second direction DR2.

The first interval DT1 between a first dummy pixel DPX1 and a second pixel PX2 adjacent (e.g., most closely adjacent) to the first dummy pixel DPX1 in the first direction DR1 may be smaller than the second interval DT2. The first interval DT1 may be defined as an interval between the first dummy pixel DPX1 and the second pixel PX2 measured in the first direction DR1.

FIG. 7 illustrates a portion of the boundary region BA defining the lower side of the boundary region BA. Referring to a portion of the boundary region BA defining an upper side of the boundary region BA, similar to that shown in FIG. 7, the first interval DT1 may be defined as an interval between a dummy pixel DPX and a second pixel PX2 measured in the first direction DR1.

Referring to FIGS. 6 and 8, the dummy pixels DPX may include a plurality of second dummy pixels DPX2 disposed in the boundary region BA substantially parallel to the first direction DR1. The second dummy pixels DPX2 may be arranged in the first direction DR1.

The first interval DT1 between a second dummy pixel DPX2 and a second pixel PX2 adjacent (e.g., most closely adjacent) to the second dummy pixel DPX2 in the second direction DR2 may be smaller than the second interval DT2. The first interval DT1 may be defined as an interval between the second dummy pixel DPX2 and the second pixel PX2 measured in the second direction DR2.

FIG. 8 illustrates a portion of the boundary region BA defining the right side of the boundary region BA. Referring to a portion of the boundary region BA defining the left side of the boundary region BA, similar to that shown in FIG. 8, the first interval DT1 may be defined as an interval between a dummy pixel DPX and a second pixel PX2 measured in the second direction DR2.

Referring to FIGS. 6 and 9, the dummy pixels DPX may include a plurality of third dummy pixels DPX3 disposed in the boundary region BA substantially parallel to the first diagonal direction DDR1. The third dummy pixels DPX3 may be arranged in the first diagonal direction DDR1.

The first interval DT1 between a third dummy pixel DPX3 and a second pixel PX2 adjacent (e.g., most closely adjacent) to the third dummy pixel DPX3 in the first direction DR1 may be smaller than the second interval DT2. In addition, the first interval DT1 between a third dummy pixel DPX3 and a second pixel PX2 adjacent (e.g., most closely adjacent) to the third dummy pixel DPX3 in the second direction DR2 may be smaller than the second interval DT2. That is, the first interval DT1 may be defined as an interval between the third dummy pixel DPX3 and the second pixel PX2 measured in the first direction DR1 and an interval between the third dummy pixel DPX3 and the second pixel PX2 measured in the second direction DR2.

FIG. 9 illustrates a portion of the boundary region BA substantially parallel to the first diagonal direction DDR1 defining the lower right side of the boundary region BA. Referring to other portions of the boundary region BA substantially parallel to the first diagonal direction DDR1 and substantially parallel to the second diagonal direction DDR2, similar to that shown in FIG. 9, the first interval DT1 may be defined as an interval between a dummy pixel DPX and a second pixel PX2 measured in each of the first and second directions DR1 and DR2.

Referring to FIGS. 6 to 9, according to embodiments of the present inventive concept, along the boundary region BA, the first intervals DT1 between the dummy pixels DPX and the second pixels PX2 with respect to the first direction DR1 and the second direction DR2 may be maintained to be uniform.

Figure 10:
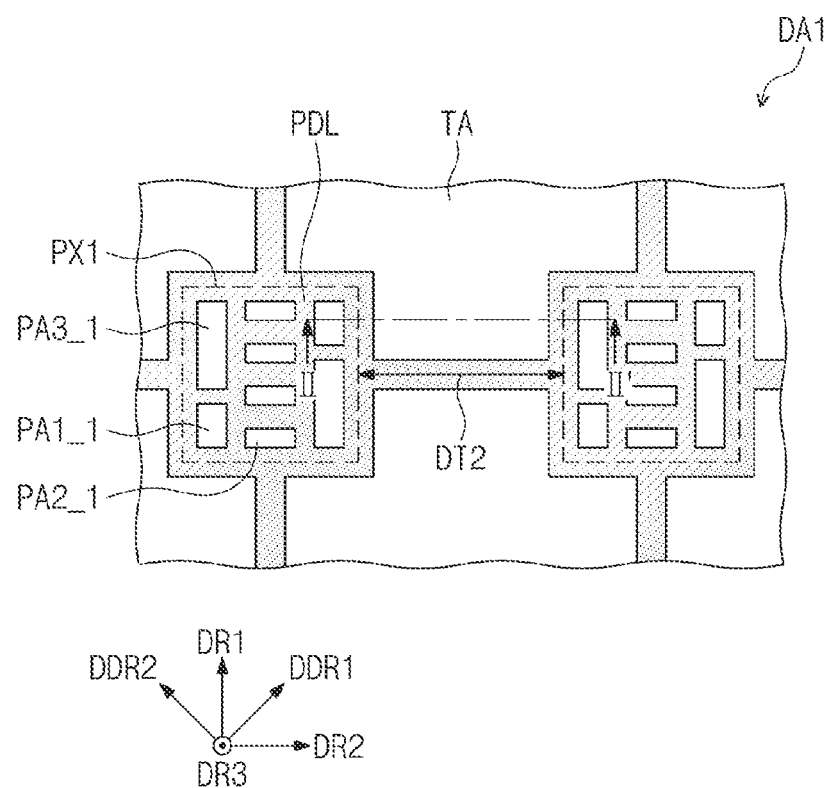
FIG. 10 is a plan view showing the configuration of first pixels illustrated in FIG. 6.

FIG. 10 is a plan view showing the configuration of first pixels illustrated in FIG. 6.

Referring to FIG. 10, two first pixels PX1 adjacent (e.g., most closely adjacent) to each other in the second direction DR2 are illustrated. Hereinafter, the structure of any one first pixel PX1 will be described, and it is to be understood that the structure of each of the plurality of first pixels PX1 may be the same as the structure described with reference to FIG. 10.

Referring to FIG. 10, the first pixel PX1 may include a plurality of light emission regions PA1_1, PA2_1, and PA3_1, which may display a plurality of colors. The light emission regions PAU, PA2_1, and PA3_1 may include a plurality of first light emission regions PA1_1, a plurality of second light emission regions PA2_1, and a plurality of third light emission regions PA3_1.

Although FIG. 10 illustrates the first pixel PX1 as including two first light emission regions PA1_1, four second light emission regions PA2_1, and two third light emission regions PA3_1, the number of each of the first, second, and third light emission regions PAU, PA2_1, and PA3_1 disposed in the first pixel PX1 is not limited thereto.

In an embodiment, the first light emission regions PA1_1 may display red, the second light emission regions PA2_1 may display green, and the third light emission regions PA3_1 may display blue. However, the color displayed by each of the first, second, and third light emission regions PA1_1, PA2_1, and PA3_1 is not limited thereto.

In an embodiment, each of the first, second, and third light emission regions PA1_1, PA2_1, and PA3_1 may have a rectangular shape, as illustrated in FIG. 10. However, the shapes of the first, second, and third light emission regions PAU, PA2_1, and PA3_1 are not limited thereto.

The first, second, and third light emission regions PAU, PA2_1, and PA3_1 may be partitioned by the pixel definition layer PDL. In addition, in an embodiment, the pixel definition layer PDL is not disposed in the transmission region TA. The pixel definition layer PDL is illustrated in FIG. 11.

The first light emission regions PA1_1 and the third light emission regions PA3_1 may extend in the first direction DR1. Herein, when an element is described as "extending in a direction", it may mean that the element extends lengthwise in the direction. One pair of the first and third light emission regions PA1_1 and PA3_1 may be arranged in the order of the third light emission region PA3_1 and the first light emission region PA1_1 in a downward direction. Another pair of the first and third light emission regions PA1_1 and PA3_1 may be arranged in the order of the first light emission region PA1_1 and the third light emission region PA3_1 in the same downward direction. Thus, the disposition order of first and third light emission regions PA1_1 and PA3_1 in adjacent (e.g., most closely adjacent) pairs of first and third light emission regions PA1_1 and PA3_1 may alternate. The one pair of the first and third light emission regions PA1_1 and PA3_1 and the another pair of the first and third light emission regions PA1_1 and PA3_1 may be spaced apart from each other in the second direction DR2.

The second light emission regions PA2_1 may extend in the second direction DR2 and may be arranged in the first direction DR1. The second light emission regions PA2_1 may be disposed between one pair of the first and third light emission regions PA1_1 and PA3_1 and another pair of the first and third light emission regions PA1_1 and PA3_1.

Figure 11:
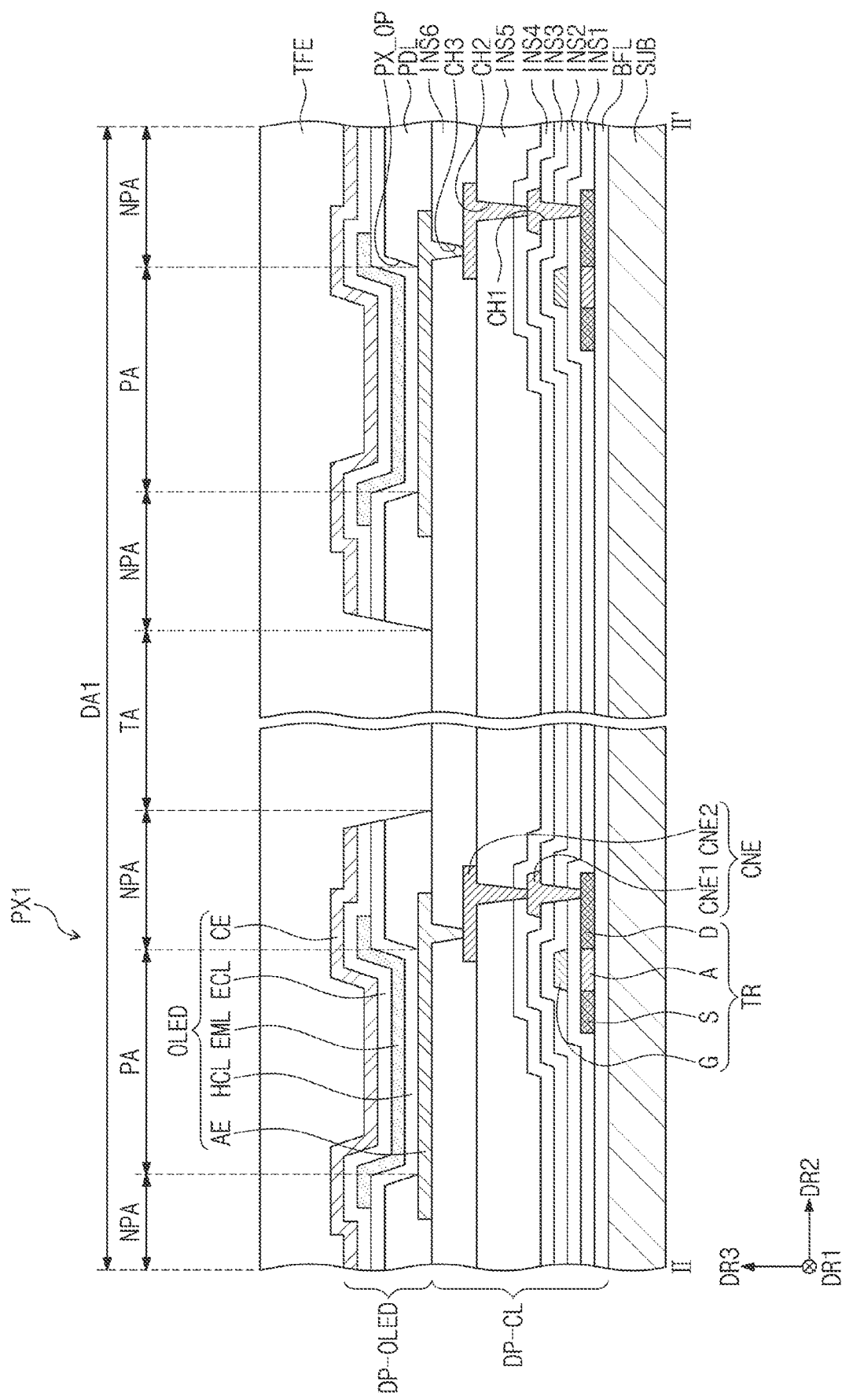
FIG. 11 is a cross-sectional view taken along line II-IF of FIG. 10.

FIG. 11 is a cross-sectional view taken along line II-IF of FIG. 10.

Hereinafter, the cross-sectional structure of any one first pixel PX1 will be described.

Referring to FIG. 11, the first pixel PX1 may include a transistor TR and a light emitting element OLED. The light emitting element OLED may include a first electrode AE, a second electrode CE, a hole control layer HCL, an electron control layer ECL, and a light emission layer EML. The transistor TR and the light emitting element OLED may be disposed on the substrate SUB.

The first display region DA1 may include a light emission region PA and a non-light emission region NPA adjacent to the light emission region PA. The non-light emission region NPA may surround the light emission region PA. The light emitting element OLED may be disposed in the light emission region PA. The light emission region PA may be any one among the first, second, and third light emission regions PA1_1, PA2_1, and PA3_1 illustrated in FIG. 10.

A buffer layer BFL is disposed on the substrate SUB, and a semiconductor pattern may be disposed on the buffer layer BFL. The semiconductor pattern may include, for example, polysilicon. However, the semiconductor pattern is not limited thereto. For example, according to embodiments, the semiconductor pattern may include, for example, amorphous silicon or a metal oxide.

The electrical properties of the semiconductor pattern may vary depending on whether the semiconductor pattern is doped. The semiconductor pattern may include a doped region and a non-doped region. The doped region may be doped with an N-type dopant or a P-type dopant. The doped region has a higher conductivity than the non-doped region, and may substantially serve as a source electrode and a drain electrode of the transistor TR. The non-doped region may substantially correspond to an active (or a channel) of a transistor.

A source S, an active A, and a drain D of the transistor TR may be formed from the semiconductor pattern. A first insulation layer INS1 may be disposed on the semiconductor pattern. A gate G of the transistor TR may be disposed on the first insulation layer INS1. A second insulation layer INS2 may be disposed on the gate G. A third insulation layer INS3 may be disposed on the second insulation layer INS2.

A connection electrode CNE may be disposed between the transistor TR and the light emitting element OLED, and may connect the transistor TR and the light emitting element OLED. The connection electrode CNE may include a first connection electrode CNE1 and a second connection electrode CNE2.

The first connection electrode CNE1 may be disposed on the third insulation layer INS3, and may be connected to the drain D through a first contact hole CH1 defined in the first to third insulation layers INS1 to INS3. A fourth insulation layer INS4 may be disposed on the first connection electrode CNE1. A fifth insulation layer INS5 may be disposed on the fourth insulation layer INS4.

The second connection electrode CNE2 may be disposed on the fifth insulation layer INS5. The second connection electrode CNE2 may be connected to the first connection electrode CNE1 through a second contact hole CH2 defined in the fourth insulating layer INS4 and the fifth insulation layer INS5. A sixth insulation layer INS6 may be disposed on the second connection electrode CNE2. Layers from the buffer layer BFL to the sixth insulation layer INS6 may be defined as the circuit element layer DP-CL.

The first electrode AE may be disposed on the sixth insulation layer INS6. The first electrode AE may be an anode electrode. The first electrode AE may be connected to the second connection electrode CNE2 through a third contact hole CH3 defined in the sixth insulation layer INS6. A pixel definition layer PDL may be disposed on the first electrode AE and the sixth insulation layer INS6. An opening PX_OP exposing a predetermined portion of the first electrode AE may be defined in the pixel definition layer PDL.

The hole control layer HCL may be disposed on the first electrode AE and the pixel definition layer PDL. The hole control layer HCL may be commonly disposed in the light emission region PA and the non-light emission region NPA. The hole control layer HCL may include a hole transport layer and a hole injection layer.

The light emission layer EML may be disposed on the hole control HCL. The light emission layer EML may be disposed in a region corresponding to the opening PX_OP. The light emission layer EML may include an organic material and/or an inorganic material. The light emission layer EML may generate light of any one of red, green, and blue colors.

The electron control layer ECL may be disposed on the light emission layer EML and the hole control layer HCL. The electron control layer ECL may be commonly disposed in the light emission region PA and the non-light emission region NPA. The electron control layer ECL may include an electron transport layer and an electron injection layer.

The second electrode CE may be disposed on the electron control layer ECL. The second electrode CE may be a cathode electrode. The second electrode CE may be commonly disposed in the first pixels PX1. A layer on which the light emitting element OLED is disposed may be defined as the display element layer DP-OLED. The thin film encapsulation layer TFE may be disposed on the light emitting element OLED.

The first voltage may be applied to the first electrode AE through the transistor TR, and the second voltage may be applied to the second electrode CE. A hole and an electron injected into the light emission layer EML are combined to form an exciton, and when the exciton transitions to a ground state, the light emitting element OLED may emit light.

The light emitting element OLED may be disposed in the transmission region TA. A pixel definition layer TFE may be disposed on the transmission region TA and the sixth insulation layer INS6. Since the light emitting element OLED is not disposed in the transmission region TA, the light transmittance of the transmission region TA may be improved.

Figure 12:
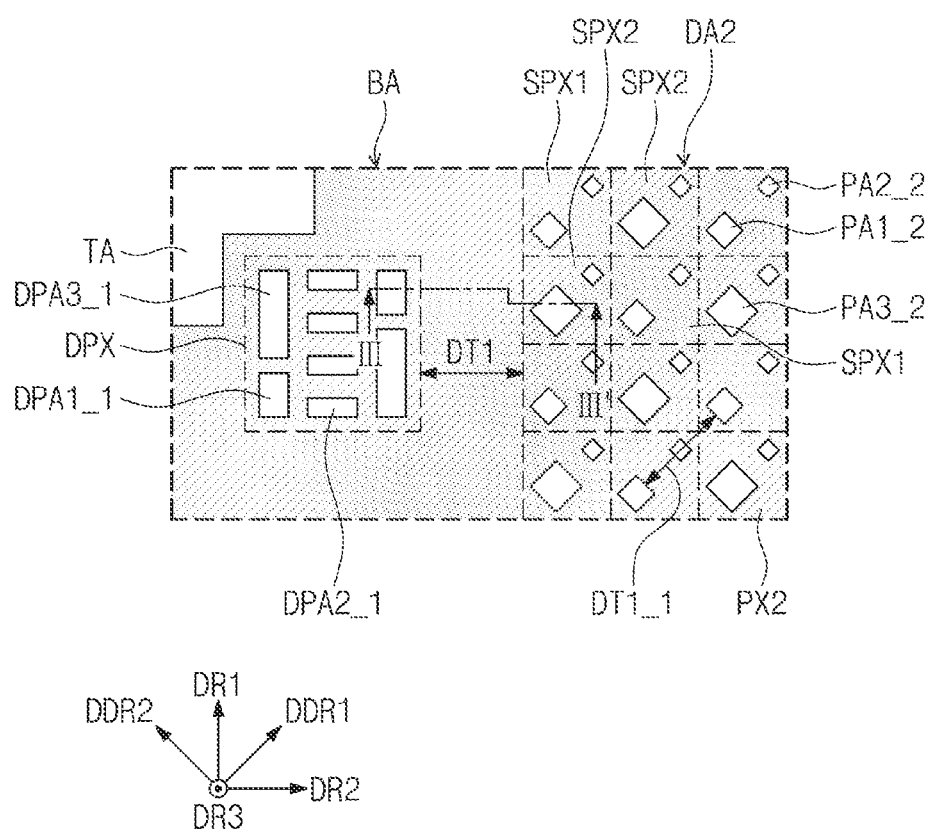
FIG. 12 is a plan view showing the configuration of one first dummy pixel and second pixels adjacent to the one first dummy pixel.

FIG. 12 is a plan view showing the configuration of one first dummy pixel and second pixels adjacent to the one first dummy pixel.

The dummy pixel DPX illustrated in FIG. 12 may be the third dummy pixel DPX3 illustrated in FIG. 9.

Referring to FIG. 12, the dummy pixel DPX may include a plurality of light emission regions DPA1_1, DPA2_1, and DPA3_1. The light emission regions DPA1_1, DPA2_1, and DPA3_1 may include a plurality of first light emission regions DPA1_1, a plurality of second light emission regions DPA2_1, and a plurality of third light emission regions DPA3_1.

The dummy pixel DPX may have substantially the same configuration as the first pixel PX1 illustrated in FIG. 10. For example, the first light emission regions DPA1_1 may be the same as the first light emission regions PAU of the first pixel PX1, the second light emission regions DPA2_1 may be the same as the second light emission regions PA2_1 of the first pixel PX1, and the third light emission regions DPA3_1 may be the same as the third light emission regions PA3_1 of the first pixel PX1.

The second pixels PX2 may include a plurality of light emission regions PA1_2, PA2_2, and PA3_2 arranged in the first diagonal direction DDR1 and in the second diagonal direction DDR2, which display a plurality of colors. The light emission regions PA1_2, PA2_2, and PA3_2 may include a plurality of first light emission regions PA1_2 configured to display red, a plurality of second light emission regions PA2_2 configured to display green, and a plurality of third light emission regions PA3_2 configured to display blue. However, the light emission regions PA1_2, PA2_2, and PA3_2 are not limited thereto.

The first, second, and third light emission regions PA1_2, PA2_2, and PA3_2 may have different shapes from the first, second, and third light emission regions DPA1_1, DPA2_1, and DPA3_1 of the dummy pixel DPX and the first, second, and third light emission regions PAU, PA2_1, and PA3_1 of the first pixel PX1. For example, the first, second, and third light emission regions PA1_2, PA2_2, and PA3_2 may have rhombic shapes.

However, the shape of the first, second, and third light emission regions PA1_2, PA2_2, and PA3_2 is not limited thereto, as long as the first, second, and third light emission regions PA1_2, PA2_2, and PA3_2 have different shapes from the first, second, and third light emission regions DPA1_1, DPA2_1, and DPA3_1 of the dummy pixel DPX and the first, second, and third light emission regions PA1_1, PA2_1, and PA3_1 of the first pixel PX1.

The size of each of the first light emission regions PA1_2 may be larger than the size of each of the second light emission regions PA2_2. The size of each of the first light emission regions PA1_2 may be smaller than the size of each of the third light emission regions PA3_2. The sizes of the first, second, and third light emission regions PA1_2, PA2_2, and PA3_2 may be defined as the areas of the first, second, and third light emission regions PA1_2, PA2_2, and PA3_2 when viewed on a plane.

The area of each of the first pixel PX1 and the dummy pixel DPX may be about the same as the area of four second pixels PX2. Each of the sum of the areas of the first, second, and third light emission regions PAU, PA2_1, and PA3_1 of the first pixel PX1 and the sum of the areas of the first, second, and third light emission regions DPA1_1, DPA2_1, and DPA3_1 of the dummy pixel DPX may be greater than the sum of the areas of the first, second, and third light emission regions PA1_2, PA2_2, and PA3_2 of the four second pixels PX2.

In FIG. 6, since the transmission regions TA are disposed in the first display region DA1, the disposition area of the first pixels PX1 to generate light may be decreased. However, according to embodiments, instead of the disposition area of the first pixels PX1 being decreased, the areas of the first, second, and third light emission regions PA1_1, PA2_1, and PA3_1 may be increased to increase the luminance of light generated in the first pixels PX1.

For example, as illustrated in FIG. 10, the areas of the first, second, and third light emission regions PAU, PA2_1, and PA3_1 of the first pixel PX1 having a quadrangular shape may be increased relative to the areas of the first, second, and third light emission regions PA1_2, PA2_2, and PA3_2 of the four second pixels PX2.

The second pixels PX2 may include a plurality of first sub-pixels SPX1 and a plurality of second sub-pixels SPX2. The first sub-pixels SPX1 and the second sub-pixels SPX2 may be alternately arranged in the first direction DR1. In addition, the first sub-pixels SPX1 and the second sub-pixels SPX2 may be alternately arranged in the second direction DR2.

Each of the first sub-pixels SPX1 may include a first light emission region PA1_2 and a second light emission region PA2_2. In each of the first sub-pixels SPX1, the first light emission region PA1_2 and the second light emission region PA2_2 may be arranged in the order of the first light emission region PA1_2 and the second light emission region PA2_2 in the first diagonal direction DDR1.

Each of the second sub-pixels SPX2 may include the second light emission region PA2_2 and a third light emission region PA3_2. In each of the second sub-pixels SPX2, the second light emission region PA2_2 and the third light emission region PA3_2 may be arranged in the order of the third light emission region PA3_2 and the second light emission region PA2_2 in the first diagonal direction DDR1.

The first interval DT1 may be about the same as an interval between light emission regions adjacent to each other in the first diagonal direction DDR1 and displaying the same color among the first, second, and third light emission regions PA1_2, PA2_2, and PA3_2. For example, the first interval DT1 may be about the same as a first sub-interval DT1_1 between the first light emission regions PA1_2 of the first sub-pixels SPX1 adjacent (e.g., most closely adjacent) to each other in the first diagonal direction DDR1. For example, the first interval DT1 may display red, and may be about the same as an interval between the first light emission regions PA1_2 adjacent to each other.

Figure 13:
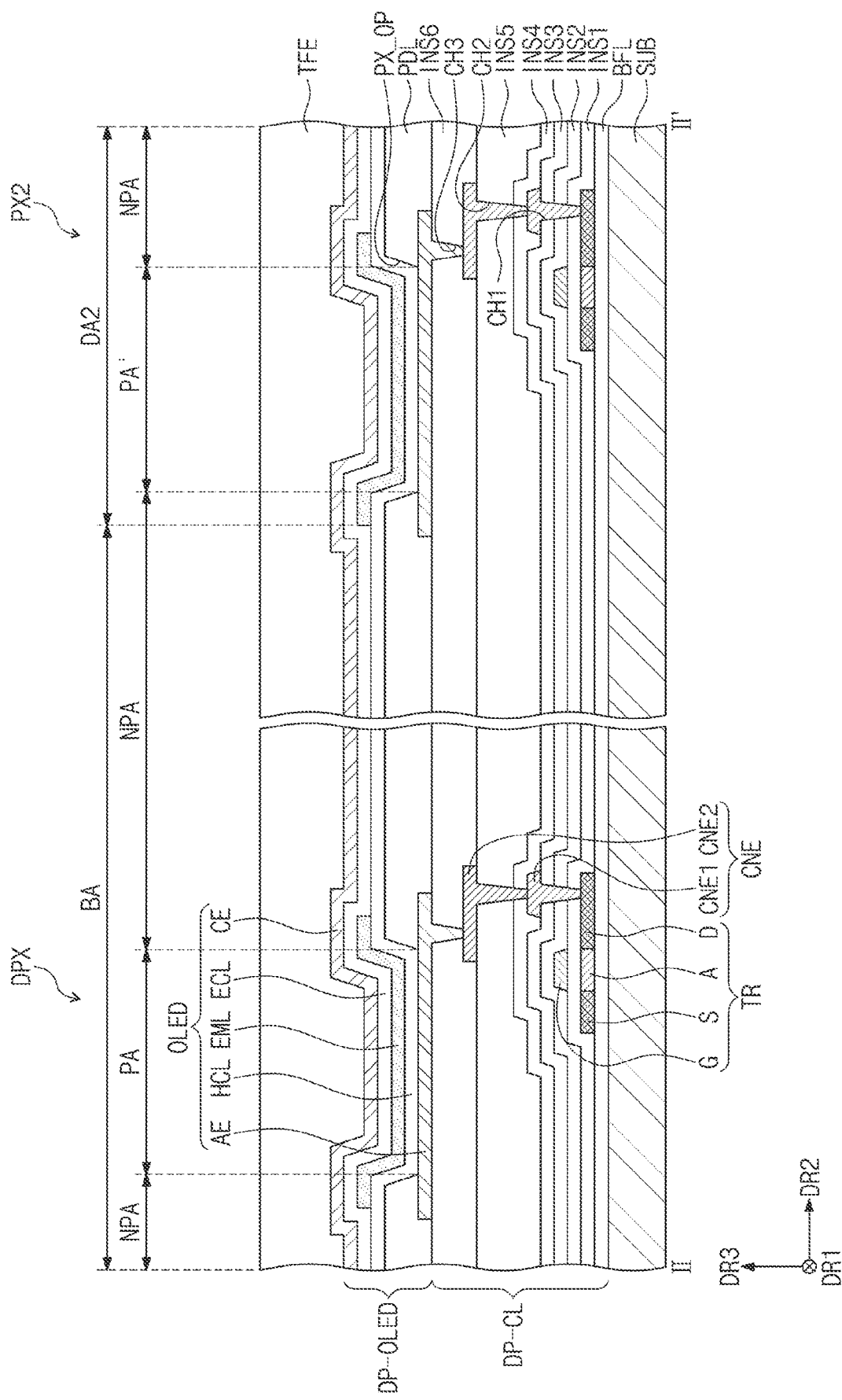
FIG. 13 is a cross-sectional view taken along line III-III' of FIG. 12.

FIG. 13 is a cross-sectional view taken along line of FIG. 12.

Referring to FIG. 13, the dummy pixel DPX may include the transistor TR and the light emitting element OLED. The boundary region BA may include the light emission region PA and the non-light emission region NPA around the light emission region PA. The light emitting element OLED may be disposed in the light emission region PA. The light emission region PA may be any one among the first, second, and third light emission regions DPA1_1, DPA2_1, and DPA3_1.

The second pixel PX2 may include the transistor TR and the light emitting element OLED. The second display region DA2 may include a light emission region PA' and the non-light emission region NPA around the light emission region PA'. The light emitting element OLED may be disposed in the light emission region PA'. The light emission region PA' may be any one among the first, second, and third light emission regions PA1_2, PA2_2, and PA3_2.

Since the cross-sectional configuration of the dummy pixel DPX shown in FIG. 13 is substantially the same as the cross-sectional configuration of the first pixel PX1 shown in FIG. 11, for convenience of explanation, a further description of elements and aspects previously described may be omitted. In addition, when viewed on a plane, the cross-sectional configuration of the second pixel PX2 is substantially the same as the cross-sectional configuration of the first pixel PX1 except for the shape of the light emission region PA', and thus, for convenience of explanation, a further description of elements and aspects previously described may be omitted.

The pixel definition layer PDL may be disposed between the light emission region PA of the dummy pixel DPX and the light emission region PA' of the second pixel PX2. That is, the boundary between the dummy pixel DPX and the second pixel PX2 may be defined by the pixel definition layer PDL. The hole control layer HCL, the electron control layer ECL, and the second electrode CE may be disposed on the pixel definition layer PDL.

Figure 14:
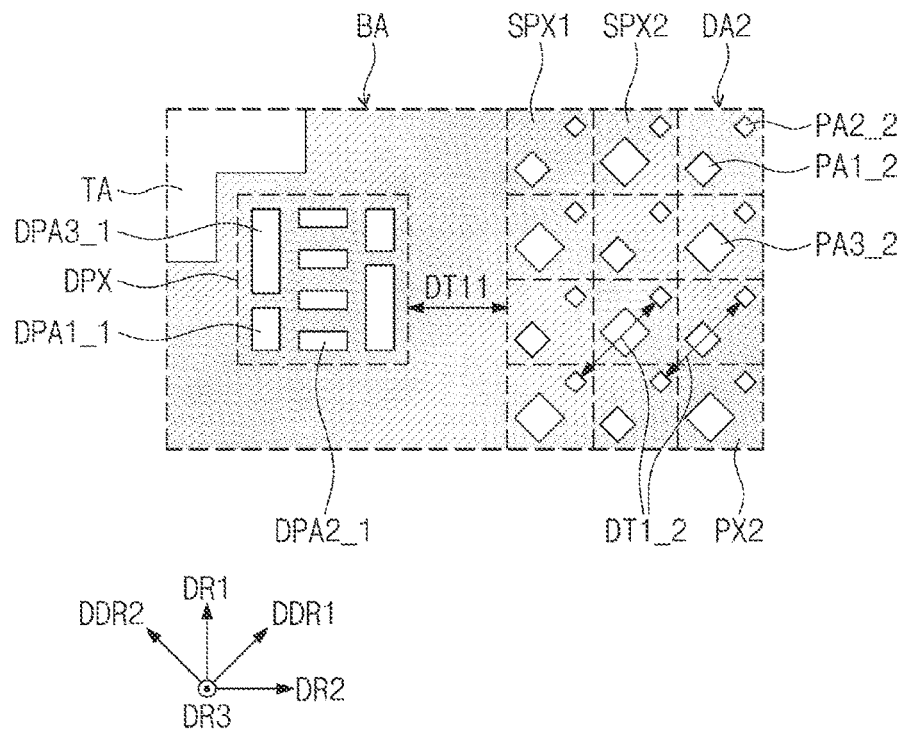
FIGS. 14, 15 and 16 are views illustrating dummy pixels according embodiments of the inventive concept and first intervals between second pixels.
Figure 15:
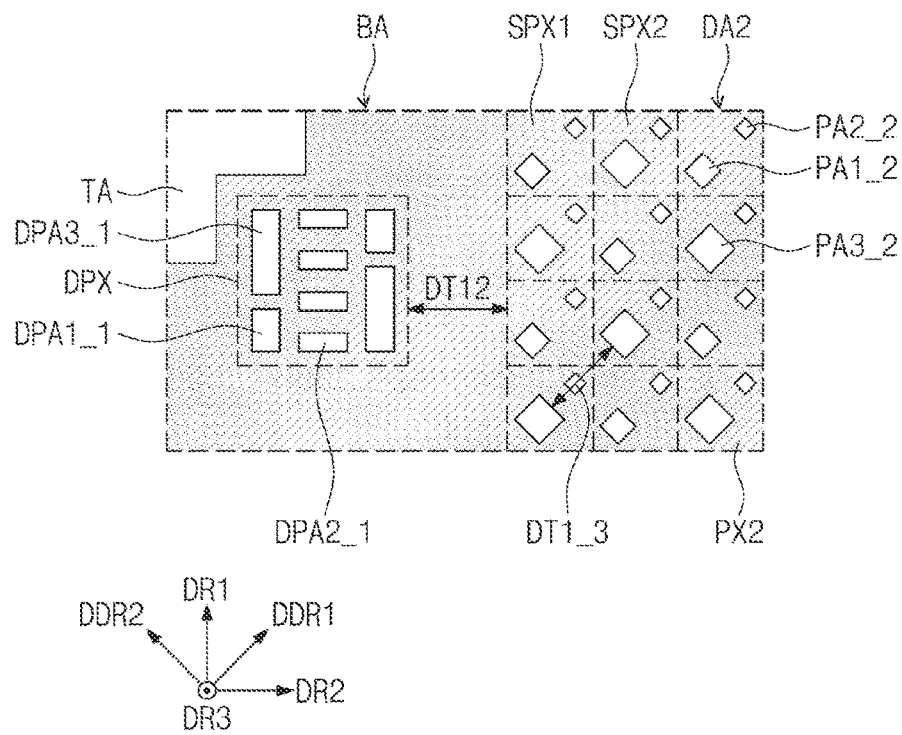
Figure 16:
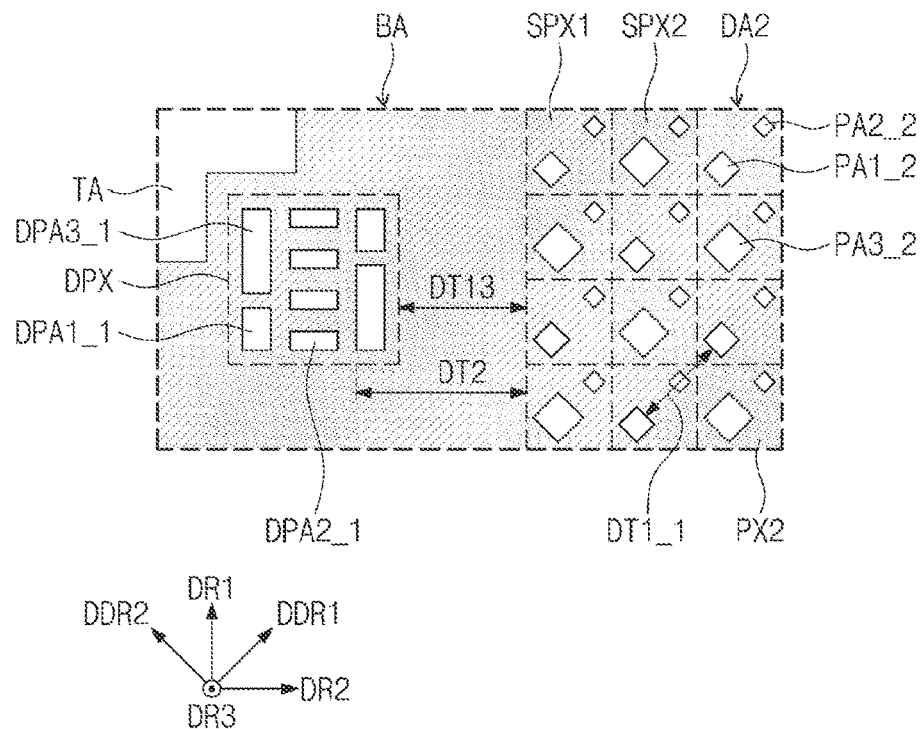

FIGS. 14, 15 and 16 are views illustrating dummy pixels according to embodiments of the inventive concept and first intervals between the second pixels.

FIGS. 14, 15 and 16 are plan views corresponding to FIG. 12, except that first intervals DT11, DT12, and DT13 respectively illustrated in FIGS. 14, 15 and 16 are different from the first interval DT1 illustrated in FIG. 12. Thus, for convenience of explanation, to the extent that a further description of elements and technical aspects previously described with reference to FIG. 12 is omitted, it may be assumed that these elements and technical aspects are at least similar to corresponding elements and technical aspects previously described with reference to FIG. 12.

Referring to FIG. 14, a first interval DT11 may be about the same as an interval between light emission regions adjacent to each other and displaying the same color among the first, second, and third light emission regions PA1_2, PA2_2, and PA3_2. For example, the first interval DT11 may be about the same as a second sub-interval DT1_2 between the second light emission regions PA2_2 of the first sub-pixels SPX1 adjacent to each other in the first diagonal direction DDR1. That is, the first interval DT11 may display green, and may be about the same as an interval between the second light emission regions PA2_2 adjacent to each other.

The second sub-interval DT1_2 may be defined as an interval between the second light emission regions PA2_2 of the second sub-pixels SPX2 adjacent to each other in the first diagonal direction DDR1.

Referring to FIG. 15, a first interval DT12 may be about the same as an interval between light emission regions adjacent to each other and displaying the same color among the first, second, and third light emission regions PA1_2, PA2_2, and PA3_2. For example, the first interval DT12 may be about the same as a third sub-interval DT1_3 between the third light emission regions PA3_2 of the second sub-pixels SPX2 adjacent to each other in the first diagonal direction DDR1. That is, the first interval DT12 may display blue, and may be about the same as an interval between the third light emission regions PA3_2 adjacent to each other.

Referring to FIG. 16, a first interval DT13 may be larger than an interval between light emission regions adjacent to each other and displaying the same color among the first, second, and third light emission regions PA1_2, PA2_2, and PA3_2, and may be smaller than the second interval DT2. For example, the first interval DT13 may be larger than the first sub-interval DT1_1 between the first light emission regions PA1_2 adjacent to each other in the first diagonal direction DDR1, and may be smaller than the second interval DT2.

However, embodiments of the present inventive concept are not limited thereto. In an embodiment, the first interval DT13 may be larger than the second sub-interval DT1_2 between the second light emission regions PA2_2 adjacent to each other in the first diagonal direction DDR1, and may be smaller than the second interval DT2. In addition, in an embodiment, the first interval DT13 may be larger than the third sub-interval DT1_3 between the third light emission regions PA3_2 adjacent to each other in the first diagonal direction DDR1, and may be smaller than the second interval DT2.

Figure 17:
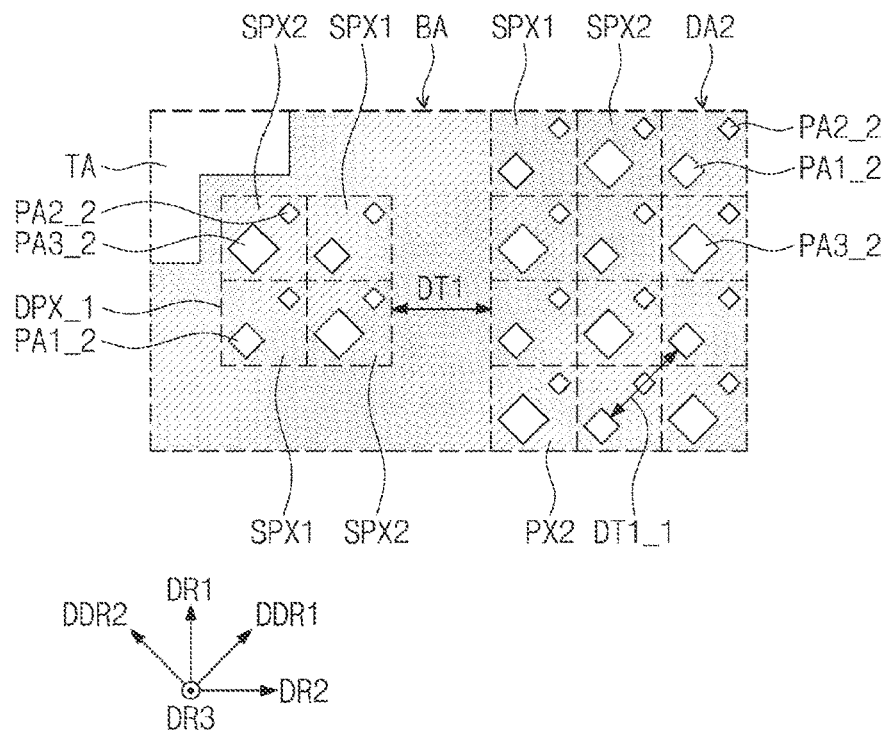
FIG. 17 is a view illustrating the configuration of a dummy pixel according to an embodiment of the inventive concept.

FIG. 17 is a view illustrating the configuration of a dummy pixel according to an embodiment of the inventive concept.

FIG. 17 is a plan view corresponding to FIG. 12.

Referring to FIG. 17, a dummy pixel DPX_1 may have substantially the same configuration as the second pixels PX2. For example, the dummy pixel DPX_1 may include a plurality of the first and second sub-pixels SPX1 and SPX2 alternately arranged in the first direction DR1 and in the second direction DR2.

Each of the first sub-pixels SPX1 of the dummy pixel DPX_1 is arranged in the first diagonal direction DDR1, and may include the first light emission region PA1_1 and the second light emission region PA2_2 having rhombic shapes. Each of the second sub-pixels SPX2 of the dummy pixel DPX_1 is arranged in the first diagonal direction DDR1, and may include the second light emission region PA2_2 and the third light emission region PA3_2 having rhombic shapes.

In an embodiment, similar to the dummy pixel DPX_1, the first pixels PX1 disposed in the first display region DA1 may also include the plurality of the first and second sub-pixels SPX1 and SPX2.

According to an embodiment of the inventive concept, since intervals between dummy pixels disposed in a boundary region and second pixels around the boundary region are maintained to be uniform along the boundary region, display defects such as, for example, a band stain, which may occur in the boundary region between a first display region and a second display region, may be prevented or reduced.

As is traditional in the field of the present inventive concept, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions.

While the present inventive concept has been particularly shown and described with reference to the embodiments thereof, it will be understood by those of ordinary skill in the art that various changes in form and detail may be made therein without departing from the spirit and scope of the present inventive concept as defined by the following claims.

What is claimed is:

1. A display device, comprising:
   a display panel;
   a plurality of first pixels disposed in a first region of the display panel;
   a plurality of second pixels disposed in a second region of the display panel adjacent to the first region; and
   a plurality of third pixels disposed in a boundary region of the display panel between the first region and the second region,
   wherein a first interval between a second pixel adjacent to the boundary region among the plurality of second pixels and a third pixel adjacent to the second region among the plurality of third pixels is smaller than a distance of a transmission region defined between adjacent first pixels among the plurality of first pixels, and the second pixel is adjacent the third pixel.

2. The display device of claim 1, wherein the first interval is smaller than a second interval between the adjacent first pixels among the plurality of first pixels.

3. The display device of claim 2, wherein:
   the first pixels and the second pixels are arranged in a first direction and a second direction which intersects the first direction; and
   the third pixel is adjacent to the second pixel in the first direction or in the second direction.

4. The display device of claim 3, wherein:
   the second pixels comprise a plurality of light emission regions configured to display a plurality of colors;
   the light emission regions are arranged in a first diagonal direction intersecting the first and second directions and in a second diagonal direction intersecting the first diagonal direction; and
   an interval between light emission regions among the plurality of light emission regions disposed adjacent to each other in the first diagonal direction and displaying a same color is about equal to the first interval.

5. The display device of claim 3, wherein each of the second pixels comprises:
   a plurality of first sub-pixels, each comprising a first light emission region and a second light emission region; and
   a plurality of second sub-pixels, each comprising the second light emission region and a third light emission region,
   wherein the first sub-pixels and the second sub-pixels are alternately arranged in the first direction and the second direction.

6. The display device of claim 5, wherein:
   the first light emission region and the second light emission region of each of the first sub-pixels are arranged in a first diagonal direction which intersects the first and second directions; and
   the third light emission region and the second light emission region of each of the second sub-pixels are arranged in the first diagonal direction.

7. The display device of claim 6, wherein the first interval is the same as an interval between first light emission regions of first sub-pixels adjacent to each other in the first diagonal direction among the first sub-pixels.

8. The display device of claim 6, wherein an interval between the second light emission regions of first sub-pixels among the plurality of first sub-pixels adjacent to each other in the first diagonal direction is about equal to the first interval.

9. The display device of claim 6, wherein an interval between the third light emission regions of second sub-pixels among the plurality of second sub-pixels adjacent to each other in the first diagonal direction is about equal to the first interval.

10. The display device of claim 5, wherein each of the first pixels and each of the third pixels comprise a plurality of light emission regions having a different shape than the first, second, and third light emission regions of the second pixels.

11. The display device of claim 5, wherein each of the first pixels and each of the third pixels comprise a plurality of light emission regions having a same shape as the first, second, and third light emission regions of the second pixels.

12. The display device of claim 2, wherein:
   the first pixels and the second pixels are arranged in a first direction and a second direction which intersects the first direction;
   the second pixels comprise a plurality of light emission regions configured to display a plurality of colors;
   the second pixels are arranged in a first diagonal direction intersecting the first and second directions and in a second diagonal direction intersecting the first diagonal direction; and
   the first interval is larger than an interval between light emission regions among the plurality of light emission regions adjacent to each other in the first diagonal direction and displaying a same color.

13. The display device of claim 1, wherein the transmission region is provided in plurality, the plurality of transmission regions are disposed between the third pixels and first pixels among the plurality of first pixels adjacent to the third pixels, and between adjacent first pixels among the plurality of first pixels.

14. The display device of claim 13, wherein a number of the transmission regions among the plurality of transmission regions adjacent to each of the third pixels are smaller than a number of the transmission regions among the plurality of transmission regions adjacent to each of the first pixels.

15. The display device of claim 1, further comprising:
   a functional element disposed below the first region of the display panel.

16. The display device of claim 1, wherein a size of each of the first pixels is greater than a size of each of the second pixels, and
wherein intervals between the third pixels and the second pixels are uniform along the boundary region.

17. A display device, comprising:
a display panel;
a plurality of first pixels disposed in a first region of the display panel;
a plurality of second pixels disposed in a second region of the display panel adjacent to the first region;
a plurality of third pixels disposed in a boundary region of the display panel between the first region and the second region; and
a plurality of transmission regions disposed between the third pixels and first pixels among the plurality of first pixels adjacent to the third pixels, and between adjacent first pixels among the plurality of first pixels,
wherein the plurality of third pixels are arranged in the same rows and columns as the plurality of first pixels, and a size of each of the third pixels is the same as a size of each of the first pixels.

18. The display device of claim 17, wherein a first interval between a first third pixel among the plurality of third pixels and a first second pixel among the plurality of second pixels and adjacent to the first third pixel is smaller than a second interval between the adjacent first pixels among the plurality of first pixels.

19. The display device of claim 17, wherein:
intervals between the second pixels and the third pixels are uniform along the boundary region; and
a number of the transmission regions among the plurality of transmission regions adjacent to each of the third pixels is smaller than a number of the transmission regions among the plurality of transmission regions adjacent to each of the first pixels.

20. The display device of claim 17, wherein:
the first pixels and the second pixels are arranged in a first direction and a second direction which intersects the first direction;
the second pixels comprise a plurality of light emission regions configured to display a plurality of colors;
the light emission regions are arranged in a first diagonal direction intersecting the first and second directions and in a second diagonal direction intersecting the first diagonal direction; and
an interval between light emission regions among the plurality of light emission regions disposed adjacent to each other in the first diagonal direction and displaying a same color is about equal to the first interval.

* * * * *